United States Patent
Whitmore et al.

(10) Patent No.: US 10,559,943 B2
(45) Date of Patent: Feb. 11, 2020

(54) LASER ASSEMBLY WITH SPECTRAL BEAM COMBINING

(71) Applicant: DAYLIGHT SOLUTIONS, INC., San Diego, CA (US)

(72) Inventors: Alexander Jason Whitmore, San Diego, CA (US); Michael Pushkarsky, San Diego, CA (US); David P. Caffey, San Diego, CA (US)

(73) Assignee: DAYLIGHT SOLUTIONS, INC., San Diego, CA (US)

( * ) Notice: Subject to any disclaimer, the term of this patent is extended or adjusted under 35 U.S.C. 154(b) by 0 days.

(21) Appl. No.: 16/242,921

(22) Filed: Jan. 8, 2019

(65) Prior Publication Data
US 2019/0214786 A1    Jul. 11, 2019

Related U.S. Application Data

(60) Provisional application No. 62/615,244, filed on Jan. 9, 2018.

(51) Int. Cl.
*H01S 5/00* (2006.01)
*H01S 5/40* (2006.01)
*H01S 5/14* (2006.01)

(52) U.S. Cl.
CPC ............ *H01S 5/4062* (2013.01); *H01S 5/143* (2013.01); *H01S 5/4012* (2013.01); *H01S 5/4025* (2013.01); *H01S 5/4031* (2013.01); *H01S 5/4087* (2013.01)

(58) Field of Classification Search
CPC ...... H01S 5/143; H01S 5/4012; H01S 5/4087; H01S 5/4062; H01S 5/4025; H01S 5/4031
See application file for complete search history.

(56) References Cited

U.S. PATENT DOCUMENTS

| 10,401,635 B2* | 9/2019 | Yu | G02B 27/30 |
| 2011/0216792 A1* | 9/2011 | Chann | G02B 27/0905 |
| | | | 372/31 |
| 2015/0364900 A1* | 12/2015 | Chann | H01S 5/4012 |
| | | | 385/31 |

(Continued)

OTHER PUBLICATIONS

Palmer, Christopher, "Diffraction Grating Handbook", Richardson Gratings Newport Corporation, Jan. 2014, Seventh Edition, Rochester NY, USA.

Primary Examiner — Kinam Park
(74) Attorney, Agent, or Firm — Roeder & Broder LLP; Steven G. Roeder

(57) ABSTRACT

A laser assembly (10) for generating an assembly output beam (12) includes a laser subassembly (16) that emits a plurality of spaced apart laser beams (20), a beam adjuster (42), a transform lens (44A), a beam combiner (46), and an output coupler (48). The beam adjuster (42) adjusts the spacing between the plurality of laser beams (20). The transform lens (44A) focuses the laser beams (20) at a focal plane (54) and the beam combiner (46) is positioned at the focal plane (54). The beam combiner (46) combines the lasers beams (20) to provide a combination beam (58). Further, the output coupler (48) redirects at least a portion of the combination beam (58) back to the beam combiner (46) as a redirected beam (60), and transmits a portion of the combination beam (58) as the assembly output beam (12).

24 Claims, 12 Drawing Sheets

(56) References Cited

U.S. PATENT DOCUMENTS

2016/0079724 A1* 3/2016 Reeves-Hall ....... H01S 3/08009
372/6
2016/0344162 A1* 11/2016 Konno ............... B23K 26/0613

* cited by examiner

LASER ASSEMBLY WITH SPECTRAL BEAM COMBINING

RELATED APPLICATION

This application claims priority on U.S. Provisional Application No. 62/615,244 filed on Jan. 9, 2018, and entitled "LASER ASSEMBLY WITH SPECTRAL BEAM COMBINING". As far as permitted, the contents of U.S. Provisional Application No. 62/615,244 are incorporated herein.

BACKGROUND

Mid Infrared ("MIR") laser assemblies that produce a MIR wavelength output beam can be used in many fields such as, in medical diagnostics, pollution monitoring, leak detection, analytical instruments, homeland security, remote chemical sensing, and industrial process control. Recently, lasers have been used to protect aircraft from sophisticated heat-seeking missiles. Manufacturers are always searching for ways to improve efficiency, beam quality, and power output of these laser assemblies.

SUMMARY

One embodiment is directed to a laser assembly that generates an assembly output beam. In this embodiment, the laser assembly includes a laser subassembly, a beam adjuster, a transform lens, a wavelength selective beam combiner, and an output coupler. The laser subassembly emits a plurality of spaced apart, substantially parallel laser beams. The beam adjuster is positioned in a path of the laser beams, and the beam adjuster can adjust the spacing between the plurality of laser beams. The transform lens is positioned in a path of the laser beams, and the transform lens collimates the laser beams and directs the laser beams to spatially overlap at a focal plane of the transform lens. The wavelength selective beam combiner is positioned at said focal plane, and the beam combiner combines the lasers beams to provide a combination beam that is directed along a combination axis. Further, the output coupler is positioned on the combination axis, and the output coupler redirects at least a portion of the combination beam back to the beam combiner as a redirected beam, and transmits a portion of the combination beam as the assembly output beam. Moreover, the laser subassembly can include a plurality of emitters, with each emitter generating a separate laser beam.

As discussed in detail below, the beam adjuster can compress the spacing between the laser beams that propagate from the laser subassembly to the transform lens. For example, in alternative, non-exclusive embodiments, the beam adjuster can reduce the spacing between the plurality of laser beams by at least one quarter, one-half, two, three, four, five, six, seven, eight, nine, or ten times for laser beams propagating from the laser subassembly towards the transform lens. As a result thereof, more emitters can be used in the laser subassembly for a given configuration of the laser assembly, a spatial width of the assembly output beam is less, and/or the size of the configuration of the laser assembly can be reduced.

Further, in certain embodiments, the beam adjuster can be tuned (i) to selectively adjust the spacing between the plurality of laser beams that propagate from the laser subassembly towards the transform lens, (ii) selectively adjust a spectral width of the assembly output beam, (iii) selectively adjust the wavenumbers of the multi-spectral assembly output beam, and (iv) improve laser beam overlap with peak of gain distribution.

Additionally, the laser assembly can include a polarization rotator that rotates a polarization of the laser beams that are directed at the beam combiner from the laser subassembly. In one embodiment, the laser beams from the laser subassembly have a first linear polarization orientation, and the polarization of these laser beams is rotated by ninety degrees so that the laser beams directed at the beam combiner have a second linear polarization orientation that is orthogonal to the first orientation. For example, the first polarization orientation can be perpendicular to an array axis of the emitters, and the second orientation is parallel to an emitter array axis of the emitters. In certain embodiments, the wavelength selective beam combiner is an optical diffraction grating) that is more efficient for laser beams having a second polarization orientation.

As provided herein, each of the plurality of laser beams generated by the laser subassembly has a different center wavenumber, and the assembly output beam is multi-spectral. Further, each of the plurality of laser beams can have a different center wavenumber that is in the infrared range. Alternatively, one or more of the laser beams can have a different center wavenumber that is outside the infrared range.

In certain embodiments, the laser assembly can also include a spatial filter positioned between the beam combiner and the output coupler to suppress optical cross-talk.

In one non-exclusive embodiment, the laser subassembly includes at least six separate emitters that cooperate to generate at least six, spaced apart, substantially parallel laser beams, with each of the separate laser beams having a different center wavenumber.

In another embodiment, the laser subassembly includes a plurality of separate emitters, with each emitter generating one of the laser beams, with each of the laser beams having a different center wavenumber. In this embodiment, the laser assembly can include a system controller that directs current individually to each of the emitters.

In yet another embodiment, the laser assembly comprises: (i) a laser subassembly that emits a first laser beam having a first center wavenumber, and a second laser beam that is substantially parallel to and spaced apart a first beam separation distance from the first laser beam, the second laser beam having a second center wavenumber that is different from the first center wavenumber; (ii) a beam adjuster positioned in a path of the laser beams, the beam adjuster adjusting the laser beams so that the first laser beam is substantially parallel to and spaced apart from the second laser beam a first adjusted separation distance that is different from the first beam separation distance; (iii) a transform lens that directs the laser beams adjusted by the beam adjuster to spatially overlap at a focal plane of the transform lens; (iv) a wavelength selective beam combiner positioned at the focal plane that combines the lasers beams to provide a combination beam that is directed along a combination axis; and (v) an output coupler positioned on the combination axis that redirects at least a portion of the combination beam back to the beam combiner as a multi-spectral redirected beam, and transmits a portion of the combination beam as the multi-spectral assembly output beam.

In this embodiment, the first laser beam from the transform lens impinges on the beam combiner at a first beam angle, and the second beam from the transform lens impinges on the beam combiner at a second beam angle that is different than the first beam angle. With this design, the combination beam is made up of a plurality of beams exiting from the beam combiner that are substantially coaxial.

In still another embodiment, the laser assembly includes (i) a laser subassembly that emits a plurality of spaced apart, substantially parallel laser beams; (ii) a transform lens positioned in a path of the laser beams, the transform lens directs the laser beams to spatially overlap at a focal plane of the transform lens; (iii) a wavelength selective beam combiner positioned at the focal plane that combines the lasers beams to provide a combination beam that is directed along a combination axis; (iv) a polarization rotator that rotates a polarization of the laser beams that are directed at the beam combiner from the laser subassembly; and (v) an output coupler positioned on the combination axis that redirects at least a portion of the combination beam back to the beam combiner as a redirected beam, and transmits a portion of the combination beam as the assembly output beam. In this embodiment, the laser beams from the laser subassembly can have a first polarization orientation, and the laser beams directed at the beam combiner from the transform lens can have a second polarization orientation that is e.g., ninety degrees different from the first orientation.

In another embodiment, the laser assembly includes (i) a laser subassembly that emits a plurality of spaced apart, substantially parallel laser beams; (ii) a transform lens positioned in a path of the laser beams, the transform lens directing the laser beams to spatially overlap at a focal plane of the transform lens; (iii) a wavelength selective beam combiner positioned at the focal plane that combines the lasers beams to provide a combination beam that is directed along a combination axis; and (iv) an output coupler positioned on the combination axis that redirects at least a portion of the combination beam back to the beam combiner as a redirected beam, and transmits a portion of the combination beam as the assembly output beam; and (v) a spatial filter positioned between the beam combiner and the output coupler that suppresses cross-talk. In this embodiment, the spatial filter can include a first spatial lens, a second spatial lens that is spaced apart from the first spatial lens, and a beam trimmer positioned between the spatial lenses.

In yet another embodiment, a method can include (i) emitting a plurality of spaced apart, substantially parallel laser beams with a laser subassembly; (ii) adjusting the spacing between the plurality of laser beams with a beam adjuster positioned in a path of the laser beams; (iii) directing the laser beams adjusted by the beam adjuster to spatially overlap a focal plane with a transform lens positioned in a path of the laser beams from the beam adjuster; (iv) combining the lasers beams to provide a combination beam that is directed along a combination axis with a wavelength selective beam combiner positioned at the focal plane of the transform lens; and (v) redirecting at least a portion of the combination beam back to the beam combiner as a redirected beam, and transmitting a portion of the combination beam as the assembly output beam with an output coupler positioned on the combination axis.

In another embodiment, the laser assembly includes (i) a laser subassembly that emits a plurality of spaced apart, substantially parallel laser beams; (ii) a beam adjuster and a transform lens positioned in a path of the laser beams, the transform lens directing the laser beams to spatially overlap at a focal plane of the transform lens; (iii) a wavelength selective beam combiner positioned at the focal plane of the transform lens that combines the lasers beams to provide a combination beam that is directed along a combination axis; and (iv) an output coupler positioned on the combination axis that redirects at least a portion of the combination beam back to the beam combiner as a redirected beam, and transmits a portion of the combination beam as the assembly output beam. In this embodiment, the beam adjuster can adjust an angle of incidence of each of the laser beams on the beam combiner.

In still another embodiment, a method includes (i) emitting a plurality of spaced apart, substantially parallel laser beams with a laser subassembly; (ii) directing the laser beams to spatially overlap at a focal plane with a transform lens; (iii) rotating the polarization of the laser beams that are directed at said focal plane; (iv) combining the lasers beams to provide a combination beam that is directed along a combination axis with a wavelength selective beam combiner positioned at said focal plane; and (v) redirecting at least a portion of the combination beam back to the beam combiner as a redirected beam, and transmitting a portion of the combination beam as the assembly output beam with an output coupler positioned on the combination axis.

In another embodiment, a method includes (i) emitting a plurality of spaced apart, substantially parallel laser beams with a laser subassembly; (ii) directing the laser beams to spatially overlap at a focal plane with a transform lens; (iii) combining the lasers beams to provide a combination beam that is directed along a combination axis with a wavelength selective beam combiner positioned at said focal plane; (iv) redirecting at least a portion of the combination beam back to the beam combiner as a redirected beam, and transmitting a portion of the combination beam as the assembly output beam with an output coupler positioned on the combination axis; and (v) positioning a spatial filter between the beam combiner and the output coupler that suppresses cross-talk.

The laser subassembly can include a first laser module having a plurality of first emitters, and a second laser module having a plurality of second emitters. Further, the first laser module can be spaced apart from the second laser module, with the first emitters and the second emitters aligned along an emitter array axis.

In another embodiment, the laser assembly includes: (i) a laser subassembly that emits a plurality of spaced apart, substantially parallel laser beams, (ii) a transform lens positioned in a path of the laser beams, the transform lens collimating the laser beams and directing the laser beams to spatially overlap at a focal plane of the transform lens; (iii) a wavelength selective beam combiner positioned at said focal plane that combines the lasers beams to provide a combination beam that is directed along a combination axis; and (iv) an output coupler positioned on the combination axis that redirects at least a portion of the combination beam back to the beam combiner as a redirected beam, and transmits a portion of the combination beam as the assembly output beam. The laser subassembly can include a first laser module having a plurality of first emitters, and a second laser module having a plurality of second emitters. The first laser module is spaced apart from the second laser module, and the first emitters and the second emitters are aligned along an emitter array axis.

For example, the first emitters of the first laser module can be spaced apart from the second emitters of the second laser module an emitter separation distance along the emitter array axis that is at least 0.5 millimeters, and each laser module includes a laser mount.

Additionally, the laser assembly can include a polarization rotator. For example, the laser beams from the laser subassembly have a first polarization orientation, and the polarization rotator rotates the polarization so that the laser beams directed at the beam combiner will have a second polarization orientation that is, e.g., ninety degrees different from the first orientation.

The laser assembly can include a beam adjuster positioned in a path of the laser beams, the beam adjuster adjusting the spacing between the plurality of laser beams.

The laser assembly can include a spatial filter positioned between the beam combiner and the output coupler that suppresses cross-talk.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1A:
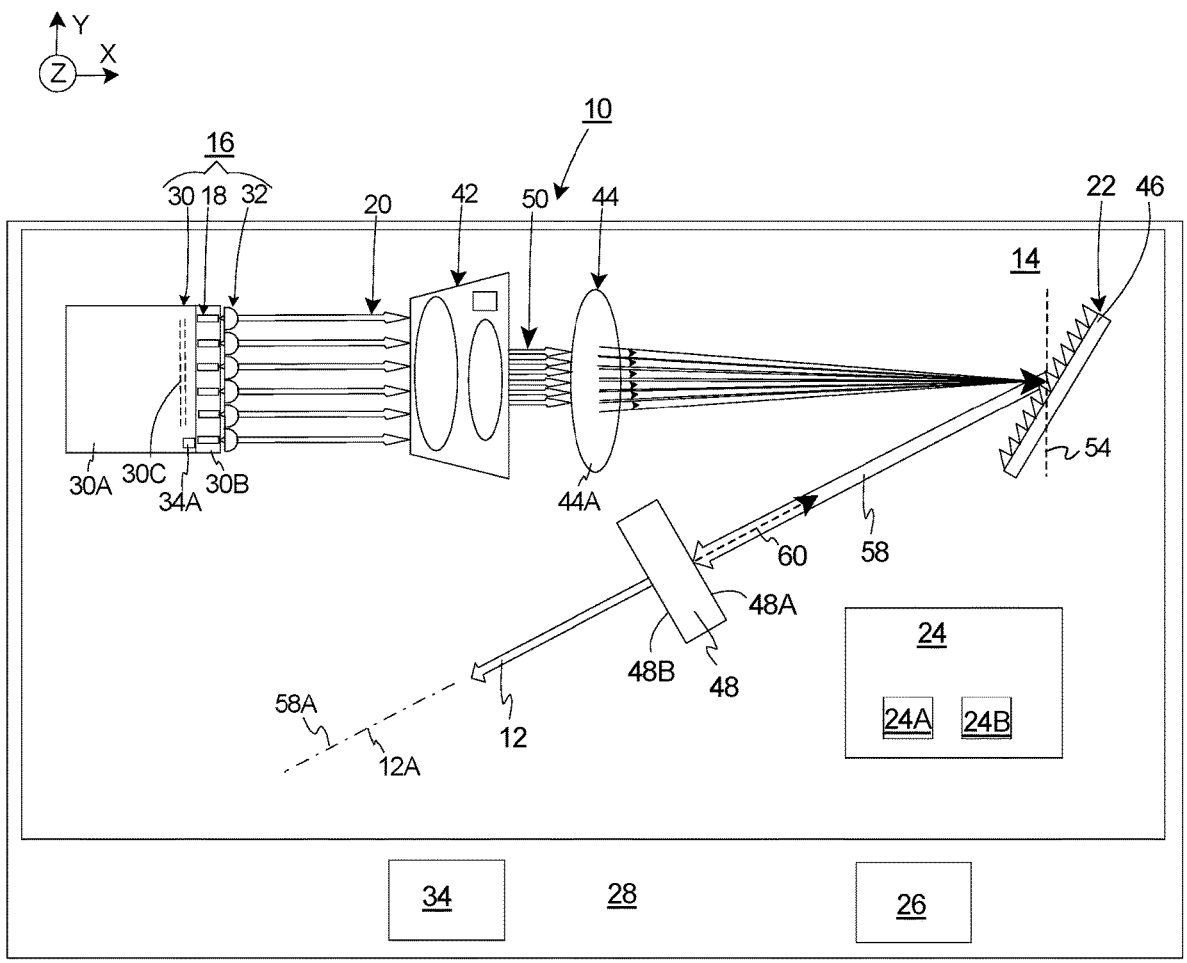
FIG. 1A is a simplified illustration of an embodiment of a laser assembly.

FIG. 1A is simplified top illustration of a first embodiment of a laser assembly 10 that generates an assembly output beam 12 (illustrated with an arrow). In certain embodiments, the laser assembly 10 includes a laser frame 14, a laser subassembly 16 that includes a plurality of emitters 18 that cooperate to generate a plurality of laser beams 20 (illustrated as arrows), a wavelength selective beam combiner subassembly 22 that transforms and combines the plurality of laser beams 20 into the assembly output beam 12, and a system controller 24 that controls the operation of the laser subassembly 16. In this embodiment, each of the laser beams 20 can be coherent. Additionally, the laser assembly 10 can include a power supply 26 (e.g. a battery, the electrical grid, or a generator) that provides electrical power to the control system 24. Further, the laser assembly 10 can be secured to a rigid mount 28 such as a test or experimental bench, a frame of a vehicle or aircraft, or other rigid structure. Moreover, the rigid mount 28 can be thermally isolated. The design of each of the components of the laser assembly 10 can be varied to vary the characteristics of the assembly output beam 12.

As an overview, in certain embodiments, the laser assembly 10 is a compact, high efficiency, high output, external cavity laser assembly 10 that spectrally combines the laser beams 20 of multiple individual emitters 18 into a single spatial, multi-spectral, output beam 12 that is diffraction-limited or near diffraction-limited. As a result thereof, multiple emitters 18, each generating a laser beam 20 having relatively moderate output power, can be combined into a multi-Watt module configuration that offers many practical benefits. For example, a lower per-facet intensity of each emitter 18 translates into lower thermal stress on the individual emitters 18, providing much longer term system reliability. In addition, emitters 18 with lower power requirements can be manufactured with much higher yields, providing a dependable supply at lower costs. Further, the combined beams provide more power while preserving good spatial quality.

Moreover, the optical power of the assembly output beam 12 can be changed by changing the number of emitters 18 used in the laser subassembly 14. Thus, the design of laser assembly 10 can be easily adjusted to add or remove emitters 18 based on the desired output power of the assembly output beam 12. As a non-exclusive example, the laser assembly 10 can be designed so that the assembly output beam 12 has an optical power of between five to fifty watts. Stated in another fashion, in alternative, non-exclusive embodiments, the laser assembly 10 can be designed so that the assembly output beam 12 has an optical power of at least five, ten, fifteen, twenty, twenty-five, thirty, thirty-five, forty, forty-five, or fifty watts. However, optical powers of less than five, or greater than fifty watts are possible.

As provided herein, the resulting assembly output beam 12 is made up of the plurality of individual laser beams 20 that are collimated and directed by the beam combiner subassembly 22 to co-propagate, and be coaxial with each other along an output axis 12A. As used herein, the term "combines" as used in regards to the assembly output beam 12 shall mean (i) that the beams are directed substantially parallel to one another (i.e, the beams travel along substantially parallel axes), and (ii) that the beams are fully or partly spatially overlapping.

Further, as provided herein, the assembly output beam 12 will be multispectral because each of the individual emitters 18 is lasing at a different center wavenumber as a result of the arrangement of the laser assembly 10. In certain embodiments, the laser assembly 10 is designed so that the assembly output beam 12 has a relatively small spectral width. In alternative, non-exclusive embodiments, the laser assembly 10 is designed so that the assembly output beam 12 has a spectral width of less than 0.025, 0.05, 0.1, 0.2, 0.3, 0.5, 0.75, 1, or 1.5 microns. For example, a ten emitter 18 design could achieve a spectral width of less than 0.1 microns, while a twenty emitter 18 design could achieve a spectral width of less than 0.2 microns.

The designs described herein provide the following benefits: (i) getting more power into the output beam 12 while preserving good spatial quality; (ii) getting high power out of the laser assembly 10 with a relatively small footprint; and/or (iii) providing different frequency pulses of light that travel down the same output axis 12A (at the same time or at different times depending on how the emitters 18 are controlled).

A number of Figures include an orientation system that illustrates an X axis, a Y axis that is orthogonal to the X axis and a Z axis that is orthogonal to the X and Y axes. It should be noted that these axes can also be referred to as the first, second and third axes.

The laser frame 14 is rigid, thermally stable, supports the other components of the laser assembly 10, and maintains the precise alignment of the components of the laser assembly 10. In FIG. 1, for simplicity, the laser frame 14 is illustrated as a flat plate. However, for example, the laser frame 14 can be a sealed or unsealed housing that encircles and provides a controlled environment for the other components of the laser assembly 10. If the laser frame 14 is a housing, the laser frame 14 can include a window (not shown) for the assembly output beam 12 to exit the laser frame 14. Further, if the laser frame 14 is sealed, it can be filled with an inert gas, or another type of fluid, or the sealed chamber can be subjected to a vacuum. Still alternatively, for example, desiccant or another drying agent can be positioned in the laser frame 14 to trap gases that could absorb laser emissions, cause corrosion, and/or to cause condensation.

In one, non-exclusive embodiment, the laser subassembly 16 includes a common laser mount 30, the plurality of emitters 18, and a lens array 32 that cooperate to generate the array of laser beams 20.

The laser mount 30 retains and secures the emitters 18 to the laser frame 14. In one embodiment, the laser mount 30 includes a mounting base 30A and a thermally conductive sub-mount 30B. In one non-exclusive embodiment, the mounting base 30A is rigid, generally rectangular shaped, and includes a plurality of embedded base passageways 30C, e.g. micro-channels (only a portion is illustrated in phantom) that allow for the circulation of a circulation fluid (not shown) through the mounting base 30A. Non-exclusive examples of suitable materials for the mounting base 30A include copper, Glidcop, MolyCopper, molybedium, copper tungsten (CuW), aluminum, and aluminum nitride (ALN).

The sub-mount 30B retains the multiple emitters 18 and secures the emitters 18 to the mounting base 30A. In one embodiment, the sub-mount 30B is rectangular plate shaped and is made of rigid material that has a relatively high thermal conductivity to act as a conductive heat spreader. In one non-exclusive embodiment, the sub-mount 30B has a thermal conductivity of at least approximately 170 watts/meter K. With this design, in addition to rigidly supporting the emitters 18, the sub-mount 30B also readily transfers heat away from the emitters 18 to the mounting base 30A. For example, the sub-mount 30B can be fabricated from a single, integral piece of copper, copper-tungsten (CuW), copper-moly, molybdenium, aluminum-nitride (AlN), beryllium oxide (BeO), diamond, silicon carbide (SiC), or other material having a sufficiently high thermal conductivity.

In certain embodiments, the material used for the sub-mount 30B can be selected so that its coefficient of thermal expansion matches the coefficient of thermal expansion of the emitters 18.

Additionally, the laser assembly 10 can include a thermal controller 34 that controls the temperature of the mounting base 30A and/or the emitters 18. For example, the thermal controller 34 can include (i) one or more pumps (not shown), chillers (not shown), heaters (not shown), and/or reservoirs that cooperate to circulate a hot or cold circulation fluid (not shown) through the base passageways 30C to control the temperature of the mounting base 30A, and (ii) a temperature sensor 34A (e.g., a thermistor) that provides feedback for closed loop control of the temperature of the mounting base 30A and/or the emitters 18. With this design, the thermal controller 34 can be used to directly control the temperature of the mounting base 30A at a predetermined temperature.

With this design, the thermal controller 34 can be used to maintain near-constant temperature of the laser assembly 10 for purposes of maintaining optical alignment over (i) a range of environmental temperatures; (ii) a range of heat loads produced when powering the emitters 18; and/or (iii) a range of heat loads generated within the optical elements due to absorption, scattering, and stray light.

In the non-exclusive embodiment illustrated in FIG. 1A, the thermal controller 34 is positioned outside the laser frame 14 and the temperature sensor 34A is positioned on the mounting base 30A. Alternatively, the thermal controller 34 can be in direct thermal contact with the mounting base 30A and/or positioned on or in the laser frame 14. Additionally, or alternatively, the thermal controller 34 can also include one or more cooling fans and/or vents to further remove the heat generated by the operation of the laser assembly 10. Further, the temperature sensor 34A can be placed in the coolant path, though other positions will also work.

The number, size, shape and design of the emitters 18 can be varied to achieve the desired characteristics of the assembly output beam 12. For example, the laser assembly 16 can include between two and fifty emitters 18 that are arranged in an emitter array. In FIG. 1A, the laser assembly 10 includes six separate, spaced apart emitters 18. As alternative, non-exclusive examples, the laser assembly 16 can include at least 4, 5, 7, 8, 9, 10, 15, 20, 25, 30, 35, 40 or 50 separate emitters 18 that are arranged in the linear emitter array.

Additionally, in alternative, non-exclusive embodiments, each emitter 18 can be designed and powered to generate at least approximately 0.5, 0.75, 1, 1.25, 1.5, or 2 watts of output power. However, other output powers are possible.

As non-exclusive examples, each of the emitters 18 can be a Quantum Cascade ("QC") gain medium, a laser diode (e.g. Gallium Antimony), or an interband cascade laser. Further, in one, non-exclusive embodiment, each emitter 18 is an infrared laser source that directly generates a laser beam 20 having a center wavelength that is in the mid to far infrared wavelength range of three to thirty microns. In another non-exclusive embodiment, each emitter 18 is a mid-infrared laser source that directly generates a laser beam 20 having a center wavelength that is in the mid-infrared wavelength range of two to twenty microns.

The density and spacing of the emitters 18 can be selected based on the ability to remove the heat with the thermal controller 34.

In certain embodiments, the emitters 18 can be bonded/mounted epi-side down to the sub-mount 30B to allow for (i) individually addressability of emitters 18; (ii) high duty factor optimization; (iii) high capacity liquid cooling of the emitters via the mounting base 30A; and/or (iv) maximum optical power while minimizing core/gain layer and facet optical temperature. For example, if each emitter 18 is a QC gain medium, each emitter 18 can be hard-soldered or soft-soldered to the sub-mount 30B directly with thin, highly-conductive solder such as Indium.

If the emitters 18 are individually addressable, (i) the laser assembly 10 will still be operational in the event of failure of one emitter or a subset of the emitters 18; and (ii) the emitters 18 can be powered on or off individually by the system controller 24. Alternatively, the emitters 18 can be electrically connected such that all of the emitters 18 are powered on or off concurrently. In contrast, if each individual emitter 18 is sequentially powered, the center wavelength (wavenumber) of the assembly output beam 12 will change as each individual emitter 18 is powered because each emitter 18 will lase at a different center wavenumber as detailed below. This allows for discretized form of spectroscopy whereby light of distinct wavenumbers can be generated independently by the distinct emitters 18 and directed at an analyte (not shown). Spectral signatures of the analyte (e.g., absorption, reflection, birefringence, etc) may be correlated to the distinct wavenumbers via e.g., time-division multiplexing i.e., encoding the emission time of each individual emitter to the detector signal. Many other schemes of encoding are possible and well known to those skilled in the art of spectroscopy. Further, the emitters may be turned on and off in subsets rather than individually to exploit possible further improvements in signal detection efficiency.

Figure 1B:
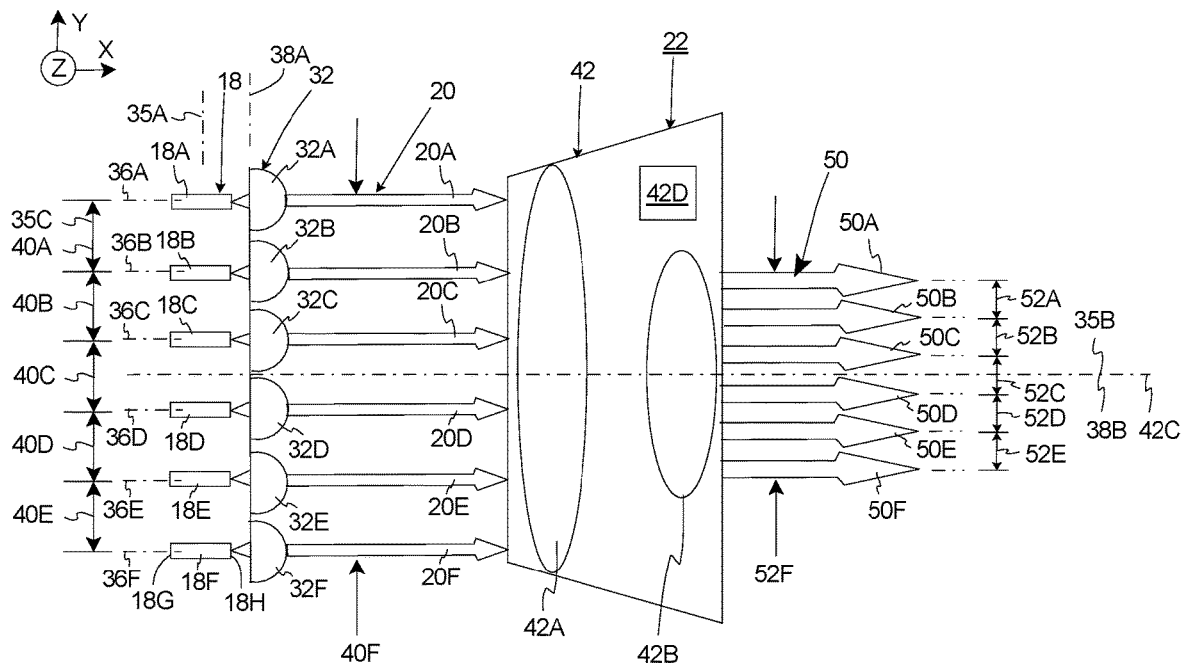
FIG. 1B is a simplified illustration of a portion of the laser assembly of FIG. 1A.
Figure 1C:
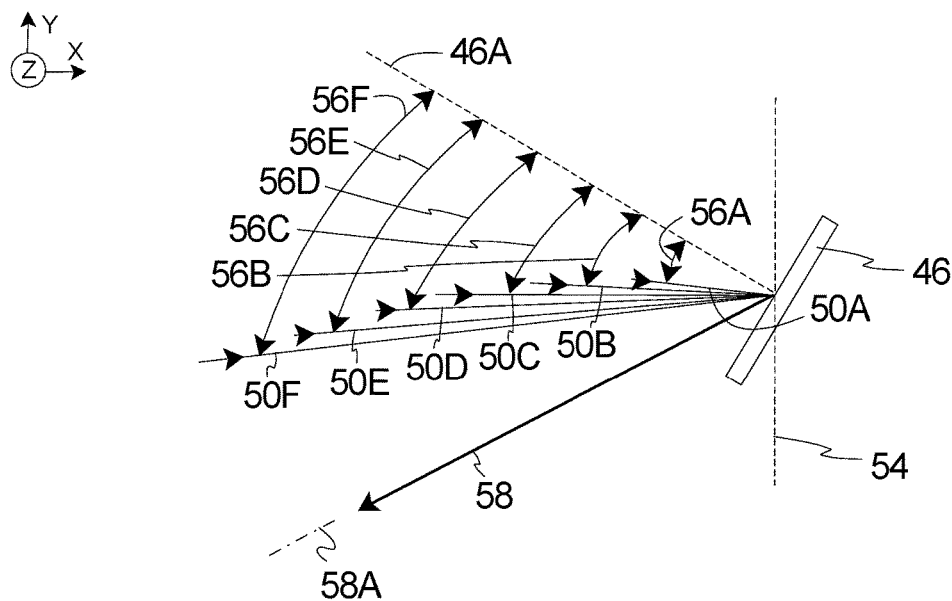
FIG. 1C is a simplified schematic illustrating features of the present invention.

FIG. 1B is an enlarged view of the emitters 18, the lens array 32, and the beam adjuster 42 of the beam combiner 22 of FIG. 1A. In this embodiment, (i) the emitters 18 are aligned and spaced apart along a one-dimensional emitter axis 35A, (ii) the emitters 18 are centered on an emitter central axis 35B, and (iii) each emitter 18 generates one of the laser beams 20. For ease of discussion, moving top to bottom, the emitters 18 can be labeled (i) a first emitter 18A that emits a first laser beam 20A along a first beam axis 36A; (ii) a second emitter 18B that emits a second laser beam 20B along a second beam axis 36B; (iii) a third emitter 18C that emits a third laser beam 20C along a third beam axis 36C; (iv) a fourth emitter 18D that emits a fourth laser beam 20D along a fourth beam axis 36D; (v) a fifth emitter 18E that emits a fifth laser beam 20E along a fifth beam axis 36E; and (vi) a sixth emitter 18F that emits a sixth laser beam 20F along a sixth beam axis 36F. It should be noted that any of the emitters 18 can be referred to as the first, second, third, etc emitter 18. Somewhat similarly, any of the laser beams 20 can be referred to as a first, second, third, etc. laser beam 20.

In one embodiment, each emitter 18 has a back facet 18G and an opposed front facet 18H that faces the lens array 32, and each emitter 18 is designed to only emit from the front facet 18H. In this embodiment, the back facet 18G is coated with a high reflectivity dielectric or metal/dielectric coating to minimize optical losses from the back facet 18G and to allow the back facet 18G of each emitter 18 to function a first laser cavity end of a cavity for each emitter 18. Further, the front facet 18H can include an anti-reflective dielectric coating to minimize coupled cavity effects within the laser assembly 10. For example, the coating on the front facet 18H can be optimized to minimize reflectivity across the available gain-bandwidth of the emitters 18. In one non-exclusive embodiment, the anti-reflective coating can have a reflectivity of less than approximately two percent, and the highly reflective coating can have a reflectivity of greater than ninety percent.

With reference to FIGS. 1A and 1B, the wavelength selective beam combiner subassembly 22 includes an output coupler 48 that functions as a common, second cavity end for each emitter 18. With this design, each emitter 18 has a separate external cavity that is defined by the back facet 18G of the respective emitter 18, and the common output coupler 48. As a result thereof, each emitter 18 operates in a separate external cavity independent from the other emitters 18.

Further, as explained in more detail below, the external cavity for each emitter 18 is slightly different. Thus, each emitter 18 will lase at a different center wavenumber, even if the characteristics of each of the emitters 18 are identical. More specifically, the first laser beam 20A, the second laser beam 20B, the third laser beam 20C, the fourth laser beam 20D, the fifth laser beam 20E, and the sixth laser beam 20F will each lase at a different center wavenumber.

With reference to FIG. 1B, an emitter spacing 35C between adjacent emitters 18 aligned along the one dimensional, emitter axis 35A can be varied based on the ability to remove the heat with the thermal controller 34 (illustrated in FIG. 1A). As alternative, non-exclusive examples, the emitter spacing 35C can be less than approximately 0.1, 0.2, 0.3, 0.4, 0.5, 0.75, 1, 1.5, 2, 2.5, or 3 millimeters. Stated in another fashion, the emitter spacing 35C can be between approximately 0.1 and 3 millimeters.

Each of the laser beams 20 emitted from the emitters 18 is diverging and not-collimated. The lens array 32 individually collimates the laser beams 20 emitted from the emitters 18. In certain embodiments, (i) the lens array 32 includes a separate micro-lens for each emitter 18, (ii) the micro-lenses are aligned and spaced apart along a one-dimensional lens array axis 38A, and (iii) the lens array 32 has a lens central axis 38B that is coaxial with the emitter central axis 35B. In certain embodiments, the lens array 32 has the same spacing (pitch) as the emitter array 18. In FIG. 1B, the micro-lenses are slightly spaced apart (and adjacent to each other) along the lens array axis 38A. Alternatively, the lens array 32 can be designed so that adjacent micro-lenses are in contact with each other (no spacing therebetween).

For ease of discussion, moving top to bottom, the lenses of the lens array 32 can labeled (i) a first lens 32A that is coaxial with the first beam axis 36A and that collimates the first laser beam 20A; (ii) a second lens 32B that is coaxial with the second beam axis 36B and that collimates the second laser beam 20B; (iii) a third lens 32C that is coaxial with the third beam axis 36C and that collimates the third laser beam 20C; (iv) a fourth lens 32D that is coaxial with the fourth beam axis 36D and that collimates the fourth laser beam 20D; (v) a fifth lens 32E that is coaxial with the fifth beam axis 36E and that collimates the fifth laser beam 20E; and (vi) a sixth lens 32F that is coaxial with the sixth beam axis 36F and that collimates the sixth laser beam 20F. Any of the lenses can be referred to as the first, second, third, etc lens.

In one, non-exclusive embodiment, each lens 32A-32F is a spherical lens having an optical axis that is aligned and coaxial with the respective beam axis 36A-36F. In one, non-exclusive embodiment, each lens 32A-32F has a diameter of between approximately 50 microns and 3 millimeters. Further, in one, non-exclusive embodiment, each lens 32A-32F is spaced apart from the respective emitter 18A-18F a working distance of between approximately 10 microns and 500 microns.

The lens array 32 creates diffraction limited or near diffraction limited laser beams 20A-20F. As non-exclusive examples, each of the lens 32A-32F can (i) be aspheric; (ii) be conic; (iii) be spherical; (iv) be Plano-Convex, Bi-convex, a Meniscus lens, or double sided; (v) be transparent in lasing optical bandwidth of the laser beams 20A-20F; (vi) be anti-reflective coated on both sides; (vii) be fabricated using greyscale lithographically fabrication; (viii) be micro-machined using diamond turning; (ix) be molded; (x) be made of a low distortion substrate; (xi) dissipate heat and prevent thermal runaway at high power; (xii) have low insertion loss; (xiii) be spaced to match emitter spacing; (xiv) include metallization to allow soldering to reduce outgassing materials and to provide conductive heat path.

In one embodiment, each of the lenses 32A-32F can have a high numerical aperture (e.g. 0.75 or greater) and can be designed to match the output from the respective emitter 18A-18F to maximize collection efficiency. Stated in another fashion, the type of material used for each lens 32A-32F can be varied to match the wavelengths of the laser beams 20A-20F. For example, for infrared emitters 18A-18F, each lens 32A-32F can comprise materials selected from the group of germanium, silicon, sapphire, or ZnSe. However, other materials may also be utilized that are effective with the wavelengths of the beams 32A-32F.

Moreover, in certain embodiments, the lenses 32A-32F (i) can have attachment points designed to maintain alignment after temperature excursions/cycles; (ii) can have a heat path to inhibit overheating and misalignment due to thermal loading; (iii) can be bonded to a coefficient of thermal expansion matched lens frame (not shown) with a thin adhesive bond line, and/or (iv) can be attached by thermally-conductive epoxy or solder to a metal lens frame.

In summary, the lens array 32 is aligned with the emitters 18 to produce the parallel laser beams 20A-20F having matching or nearly matching divergences. In this embodiment, (i) the center of the first laser beam 20A is spaced apart from the center of the adjacent second laser beam 20B a first beam separation distance 40A; (ii) the center of the second laser beam 20B is spaced apart from the center of the adjacent third laser beam 20C a second beam separation distance 40B; (iii) the center of the third laser beam 20C is spaced apart from the center of the adjacent fourth laser beam 20D a third beam separation distance 40C; (iv) the center of the fourth laser beam 20D is spaced apart from the center of the adjacent fifth laser beam 20E a fourth beam separation distance 40D; and (iv) the center of the fifth laser beam 20E is spaced apart from the center of the adjacent sixth laser beam 20F a fifth beam separation distance 40E. In one, non-exclusive embodiment, each beam separation distance 40A-40E can be between 0.05 and 3 millimeters. Further each beam separation distance 40A-40E can be the same or slightly different.

As illustrated in FIG. 1B, the array of laser beams 20 have a combined beam profile 40F measured transverse to the emitter central axis 35B. As a non-exclusive example, the laser subassembly 16 can be designed so that the combined beam profile 40F is between approximately 0.5 and 100 millimeters.

With reference back to FIG. 1A, the wavelength selective beam combiner subassembly 22 transforms and combines the array of laser beams 20 into the assembly output beam 12. In this embodiment, the beam combiner subassembly 22 includes a beam adjuster 42, a transform lens assembly 44, a wavelength selective beam combiner 46, and the output coupler 48. The design of each of these components can be varied to adjust the characteristics of the assembly output beam 12.

The beam adjuster 42 can be a beam compressor that adjusts the spacing between the laser beams 20 and adjusts the spectral width of the assembly output beam 12. Depending upon the direction in which the laser beams are propagating, the beam adjuster 42 can spatially demagnify or spatially magnify the laser beams. In FIG. 1A, the beam adjuster 42 is positioned in a path of the laser beams 20 from the laser subassembly 16 between the lens array 32 and the transform lens assembly 44. In this embodiment, for the laser beams 20 propagating left to right in FIG. 1A, the beam adjuster 42 is designed to converge and subsequently collimate (demagnify) the laser beams 20 to provide an array of adjusted laser beams 50 that are more tightly packed. In this design, the individual beams 20 leaving the microlens array 32 are slightly diverging. When the beams leave the beam adjuster 42, the beams will be diverging a magnification factor times the divergence entering the beam adjuster 42. The magnification factor is the same as the factor they are spatially compressed by the beam adjuster 42. For example, for FIG. 1A, a 3× beam adjuster 42 will result in a three times compression of the beams 20 directed left to right, and a three times divergent for beams 20 directed from right to left.

As provided herein, the specific center wavenumber of the laser beam 20 generated by each emitter 18 is tied to an angle of incidence of its respective laser beam 20 on the wavelength selective beam combiner 46. Further, the angle of incidence of each laser beam 20 on the wavelength selective beam combiner 46 is tied to the spacing of the laser beams 20 at the transform lens assembly 44. With this design, when the beam adjuster 42 reduces the spacing between the laser beams 20, the beam adjuster 42 also reduces the range of angles of incidences on the beam combiner 46, and thus reduces the spectral width of the assembly output beam 12.

With this design, the beam adjuster 42 can be used to increase the number of emitters 18 that can be used for a given form factor by compressing the spacing between the beams 20, while still maintaining a relatively small spectral width. Stated in another fashion, the beam adjuster 42 allows for the use of a relatively large number of adequately spaced apart emitters 18 for a relatively small form factor. Further, by compressing the spacing between the beams 20, a smaller transform lens assembly 44 can be used and/or the space between the transform lens assembly 44 and the beam combiner 46 can be reduced. As a result thereof, the size of the laser assembly 10 can be reduced.

Moreover, because the beam adjuster 42 compresses the spacing between the beams 20, the spectral width of the assembly output beam 12 is reduced, and the wavelengths of the beams 20 from the emitters 18 are relatively close and can fit under the spectral beam peak. This improves the efficiency of the laser assembly 10 and the output of the assembly output beam 12.

Alternatively, for laser beams propagating from right to left in FIG. 1A, the beam adjuster 42 diverges and subsequently collimates (magnifies) the laser beams 20. With this design, the beam adjuster 42 expands the spacing between the laser beams moving right to left so that the laser beams 20 are properly spaced to be directed back to the respective emitters 18.

With reference to FIG. 1B, in one embodiment, the beam adjuster 42 is a two lens system that functions somewhat similar to telescope that reduces (demagnifies) the spacing between the laser beams propagating left to right in FIG. 1B, and expands (magnifies) the spacing (divergence) of the laser beams propagating right to left in FIG. 1B. In this embodiment, the beam adjuster 42 can include a first adjuster lens 42A and a second adjuster lens 42B that are spaced apart along an adjuster central axis 42C that can be coaxial with the emitter central axis 35B and the lens central axis 38B. In this embodiment, the first adjuster lens 42A is closer than the second adjuster lens 42B to the emitters 18.

Further, in this embodiment, the first adjuster lens 42A can be a positive lens, and the second adjuster lens 42B can be a negative lens which compresses the chief rays of the emitters spatially. Moreover, in this embodiment, each of the beams 20 is transmitted through the common first adjuster lens 42A concurrently and through the common second adjuster lens 42B concurrently.

In one embodiment, the beam adjuster 42 can be somewhat similar in design to a refracting telescope, such as a Galilean telescope or a Keplerian telescope.

For laser beams moving left to right, the first adjuster lens 42A contracts and/or converges the spacing between the laser beams, and the second adjuster lens 42B subsequently re-directs the laser beams 20 to be parallel again. Stated in another fashion, for the laser beams 20 propagating left to right in FIG. 1B, the beam adjuster 42 demagnifies the laser beams 20 to provide an array of parallel, adjusted laser beams 50 that are more tightly packed. Moving top to bottom, (i) the first laser beam 20A is transformed into the first adjusted laser beam 50A; (ii) the second laser beam 20B is transformed into the second adjusted laser beam 50B; (iii) the third laser beam 20C is transformed into the third adjusted laser beam 50C; (iv) the fourth laser beam 20D is transformed into the fourth adjusted laser beam 50D; (v) the fifth laser beam 20E is transformed into the fifth adjusted laser beam 50E; and (vi) the sixth laser beam 20F is transformed into the sixth adjusted laser beam 50F.

In this embodiment, (i) the center of the first adjusted laser beam 50A is spaced apart from the center of the adjacent, second adjusted laser beam 20B a first adjusted beam separation distance 52A; (ii) the center of the second adjusted laser beam 50B is spaced apart from the center of the adjacent, third adjusted laser beam 50C a second adjusted beam separation distance 52B; (iii) the center of the third adjusted laser beam 50C is spaced apart from the center of the adjacent, fourth adjusted laser beam 50D a third adjusted beam separation distance 52C; (iv) the center of the fourth adjusted laser beam 50D is spaced apart from the center of the adjacent, fifth adjusted laser beam 50E a fourth adjusted beam separation distance 52D; and (iv) the center of the fifth adjusted laser beam 50E is spaced apart from the center of the adjacent sixth adjusted laser beam 50F a fifth adjusted beam separation distance 52E.

In one, non-exclusive embodiment, each adjusted beam separation distance 52A-52E can be between 0.03 and 3 millimeters. Further each adjusted beam separation distance 52A-52E can be the same or slightly different. Moreover, in certain embodiments, each beam separation distance 40A-40E is greater than each corresponding adjusted beam separation distance 52A-52E. Moreover, as illustrated in FIG. 1B, the array of adjusted laser beams 50 can have an adjusted, combined beam profile 52F measured transverse to the adjuster central axis 42C.

As a non-exclusive alternative embodiments, (i) for laser beams propagating left to right, the beam adjuster 42 can reduce the spacing of the laser beams by a factor of between approximately 1.1 and ten; and (ii) for laser beams propagating right to left, the beam adjuster 42 will increase the spacing of the laser beams by the same factor. Stated in another fashion, in certain non-exclusive alternative embodiments, (i) for laser beams moving left to right, the beam adjuster 42 can reduce the spacing of the laser beams by a factor of at least one and one-tenth, one and one-half, two, three, four, five, six, seven, eight, nine, or ten; and (ii) for laser beams moving right to left, the beam adjuster 42 can increase the spacing of the laser beams by the same factor. Stated in yet another fashion, in alternative, non-exclusive embodiments, the beam adjuster 42 can be designed so that each beam separation distance 40A-40E is at least one and one-tenth, one and one-half, two, three, four, five, six, seven, eight, nine, or ten time greater than each corresponding adjusted beam separation distance 52A-52E. Stated in still another fashion, in alternative, non-exclusive embodiments, the beam adjuster 42 can be designed so that the combined beam profile 40F is at least one and one-tenth, one and one-half, two, three, four, five, six, seven, eight, nine, or ten time greater than the adjusted, combined beam profile 52F.

Moreover, by compressing the beams, the beam adjuster 42 will adjust the angle of incidence of almost all of the beams onto the beam combiner 46. For example, an angle of incidence of a center beam may not be affected by the beam adjuster 42, while the angle of incidence of the other beams will be adjusted by the beam adjuster 42.

The lenses 42A, 42B can be optimized (i) for low loss, aberration, and distortion; (ii) to preserve power efficiency in external cavity; (iii) for narrow or wide array width of the element array; (iv) for narrow or wide gain-bandwidth of the emitters 18; (v) for high beam quality; and/or (vi) for a field of view that matches the laser beams 20. In FIG. 1B, the adjuster lenses 42A, 42B are transmissive. Alternatively, the beam adjuster 42 can be designed to be comprised of reflective optical elements or a combination of reflective and transmissive optical elements.

Additionally, in one non-exclusive embodiment, the beam adjuster 42 can include a lens mover 42D (illustrated as a box) that moves one or both of the adjuster lenses 42A, 42B to selectively adjust the characteristics (e.g. the demagnification) of the beam adjuster 42. For example, the lens mover 42D can include one or more actuators that are controlled by the system controller 24 (or manually) to selectively adjust the spacing between lenses 42A, 42B, along the adjuster central axis 42C. This will allow for variable magnification (zoom) to allow for selective adjustment of the spectral width of the assembly output beam 12, and adjustment of the wavenumbers that make up the assembly output beam 12, while maintaining the spacing between the lens array 32 and the transform lens assembly 44.

Generally speaking, as the demagnification is increased, (i) the spacing between adjacent adjusted laser beams 50 is decreased, (ii) the range of angles of incidences of the laser beams 50 on the beam combiner 46 is decreased, and (iii) the spectral width of the assembly output beam 12 is decreased. Conversely, as the demagnification is decreased, (i) the spacing between adjacent adjusted laser beams 50 is increased, (ii) range of angles of incidences of the laser beams 50 on the beam combiner 46 is increased, and (iii) the spectral width of the assembly output beam 12 is increased.

In certain embodiments, the wavelength selective beam adjuster 42 also reduces and suppresses optical crosstalk. This improves the efficiency of each of the emitters 18.

With reference back to FIG. 1A, the transform lens assembly 44 up-collimates the adjusted laser beams 50, and then directs and spatially overlaps the individual laser beams 50 onto a focal plane 54 of the transform lens assembly 44, and the wavelength selective beam combiner 46 is positioned at least partly at the focal plane 54. The focal plane 54 is perpendicular to the optical axis of the transform lens assembly 44 (e.g. the co-axis of the lens elements of the transform assembly). The transform lens assembly 44 includes at least one transform lens 44A. The transform lens assembly 44 can be optimized (i) for high extraction/power efficiency; (ii) for narrow or wide array width; (iii) for narrow or wide gain-bandwidth emitters; (iv) for high beam quality; and/or (v) for a field of view that matches the adjusted laser beams 50.

With the present design, each of the laser beams 50 will be incident on the beam combiner 46 at a different angle of incidence (relative to normal of the beam combiner 46). More specifically, with reference to FIG. 10, (i) the first adjusted laser beam 50A will have a first angle of incidence 56A relative to normal 46A of the beam combiner 46 (illustrated as a box); (ii) the second adjusted laser beam 50B will have a second angle of incidence 56B relative to normal 46A of the beam combiner 46 and the focal plane 54; (iii) the third adjusted laser beam 50C will have a third angle of incidence 56C relative to normal 46A of the beam combiner 46; (iv) the fourth adjusted laser beam 50D will have a fourth angle of incidence 56D relative to normal 46A of the beam combiner 46; (v) the fifth adjusted laser beam 50E will have a fifth angle of incidence 56E relative to normal 46A of the beam combiner 46; and (vi) the sixth adjusted laser beam 50E will have a sixth angle of incidence 56E relative to normal 46A of the beam combiner 46. Further, each angle of incidence 56A-56F will be different.

Figure 10:
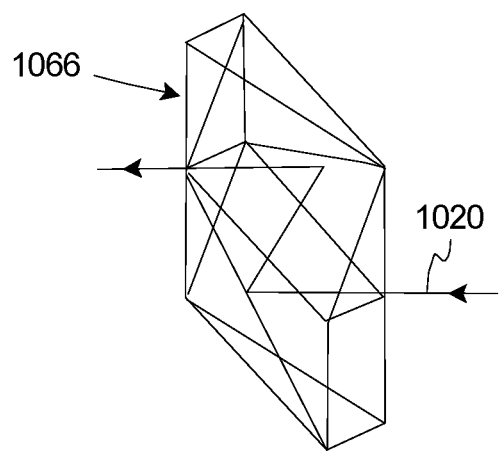
FIG. 10 is a simplified illustration of another embodiment of a polarization rotator.

It should be noted that with the design illustrated in FIGS. 1A and 10, each beam 50A-50F will exit the beam combiner 46 at substantially the same angle relative to normal 46A.

In the external cavity arrangements disclosed herein, the design of the beam combiner 46, and the angle of incidence 56A-56F of each laser beam 50A-50F on the beam combiner 46 will dictate what wavelength will experience the least loss per round trip in the external cavity and thus dominate the center wavenumber of the respective laser beam 50A-50F. Thus, the spectral width of the adjusted output beam 20, and the individual center wavenumber each emitter 18 is lasing at, can be adjusted by adjusting the angle of incidences 56A-56F via the beam adjuster 42.

With reference to FIGS. 1A and 10, the beam combiner 46 combines the laser beams 50A-50F into a multi-spectral, combination beam 58 that is directed along a common combination axis 58A. In this embodiment, the combination beam 58 is made up of the laser beams 50A-50F that are directed by the beam combiner 54 to be coaxial. Further, the combination beam 58 has minimal degradation when compared to the original laser beams 50A-50F. In certain embodiments, the beam quality of the combined beam is not greatly degraded over the beam quality of the individual beams. In one specific embodiment, a M-squared value of the combined beam is not much larger than a M-squared value of the individual beams. For example, the M-squared value of the combined beam can be between 1.1-1.2 and the M-squared value of each of the individual beams can be between 1.1-1.2.

In one embodiment, the wavelength selective beam combiner 46 is a dispersive beam combiner such as a diffraction grating (i) having high diffraction efficiency for a wide range of angles of incidences; (ii) that can handle forward and reverse propagating beams; (iii) that is designed for high power; (iv) that is photo-etched, ruled, replicated, gray scale, binary; (v) that has low scatter; (vi) that has a low coefficient of thermal expansion, (vii) that has high optical flatness, and/or (vii) that is optimized for the wavenumbers of the emitters 18. In FIG. 1A, the beam combiner 46 is a reflective diffraction grating that can be aluminum, silver, or gold coated. In this embodiment, the diffraction grating 46 is a plate that includes a large number of very fine parallel grooves that have an inter-groove spacing referred to as the grating period ("GP").

Alternatively, the beam combiner 46 can be a transmission grating that is transmissive to the wavelengths generated by the emitter 18 and coated on both sides with appropriate anti-reflective coatings. Still alternatively, the beam combiner 46 can be a single prism, or diffractive optical element (DOE).

With reference back to FIG. 1A, the output coupler 48 is positioned on the combination axis 58A and functions as the second defining boundary of the external cavity for each emitter 18. In one embodiment, the output coupler 48 is an optical element that includes a first coupler side 48A that is coated with a partly reflective coating that is optimized to maximize extraction efficiency for all emitters 18, and a second coupler side 48B that is coated with an anti-reflective coating. With this design, the first coupler side 48A cooperates with the back facet 18G of each emitter 18 to form an external cavity for each emitter 18. Stated in another fashion, in this design, the first coupler side 48A redirects at least a portion of the combination beam 58 back to the beam combiner 46 as a multi-spectral redirected beam 60 (illustrated as a dashed line), and transmits a portion of the combination beam 46 as the multi-spectral assembly output beam 12 along the output axis 12A that is coaxial with the combination axis 58A in this embodiment.

In one non-exclusive embodiment, (i) the first coupler side 48A has a reflectivity of between approximately one to thirty percent, (ii) the output coupler 48 has a high thermal conductivity; (iii) the anti-reflective coated second coupler side 48B reduce optical losses; and (iv) the output coupler 48 can be wedged to reduce feedback.

The fraction of the beam reflected by the output coupler 60 retraces the path of 58 in reverse, the beam combiner 46 now acting as chromatic beam splitter, and the optical elements returning beams of distinct wavenumbers to their respective emitters. Explicitly, the multi-spectral redirected beam 60 is incident on the beam combiner 46 at the same angle (e.g. relative to normal 46A), but will create different laser beams exiting from the beam combiner 46 at different angles (which correspond to the angle of incidences 56A-56F), based on the respective wavenumbers in the redirected beam 60. Stated in another fashion, each laser beam returning from the beam combiner 46 will be at a different return angle based on wavenumber, these angles being, by wavenumber, the same as the incident angles. In turn, the wavenumber-distinct optical feedback to each of the individual emitters creates the lowest-loss condition for that emitter thereby driving the individual laser to resonate ("lase") at that wavenumber. Thus, with the present design, each emitter in combination with the external optics comprises a laser lasing with a center wavenumber dictated by geometry, and specifically dictated by the position of the individual emitter within the array.

The system controller 24 controls the operation of the components of the laser assembly 10. For example, the system controller 24 can include one or more processors 24A, and one or more electronic storage devices 24B. In certain embodiments, the system controller 24 can control the electron injection current to the individual emitters 18A-18F, and control the thermal controller 34 to control the temperature of the mounting base 30A.

In certain embodiments, the system controller 24 individually directs current to each of the emitters 18A-18G. For example, the system controller 24 can continuously direct power to one or more of the emitters 18A-18G. Alternatively, for example, the system controller 24 can direct power in a pulsed fashion to one or more of the emitters 18A-18G. In one embodiment, the duty cycle is approximately fifty percent. Alternatively, the duty cycle can be greater than or less than fifty percent.

It should be noted that in the pulsed mode of operation, the system controller 24 can simultaneous direct pulses of power to each of the emitters 18A-18G so that each of the emitters 18A-18G generates the respective beams 20A-20F at the same time. In this design, the assembly output beam 12 is multi-spectral and made up the combined individual laser beams 20A-20F.

Alternatively, the system controller 24 can direct pulses of power to one or more of the emitters 18A-18G at different times so that the emitters 18A-18G generate the respective beam 20A-20G at different times. In this design, the characteristics of the assembly output beam 12 can be controlled by which of the emitters 18A-18F are currently activated. For example, in this design, each of the emitters 18A-18F can be activated sequentially to generate an assembly output beam 12 having a center wavenumber that changes over time. This design allows for individually controllable emitter 18 (channels) for individual wavenumber generation for spectroscopy or other applications. Additionally, the lens mover 42 of the beam adjuster 42 can be controlled to move one or both of the adjuster lenses 42A, 42B to selectively adjust the individual wavenumbers of the assembly output beam 12.

As provided herein, the system controller 24 can accept analog, digital or software transmitted commands to pulse the assembly output beam 12 with the desired pulse width and repetition rate. This feature allows the user to precisely adjust the characteristics of the assembly beam 12 to meet the system requirements of the laser assembly 10.

The system controller 24 can utilize voltage or light-sensing circuitry to shut down in case of failure of one or more of the emitters 18, to balance power, and/or to allow 'digital' spectroscopy whereby individual wavenumbers can be operated independently.

In certain embodiments, with the present designs, the beam combiner subassembly 22 is a high efficiency beam combiner. As alternative, non-exclusive examples, the beam combiner subassembly 22 can have a combination efficiency of at least 70, 75, 80, 85, 90, 95, 98, or 99 percent. For example, if the combiner subassembly 22 has a combination efficiency of eighty percent, this means that the output power of the assembly output beam 12 is eighty percent of the combined output powers of the emitters 18.

Figure 1D:
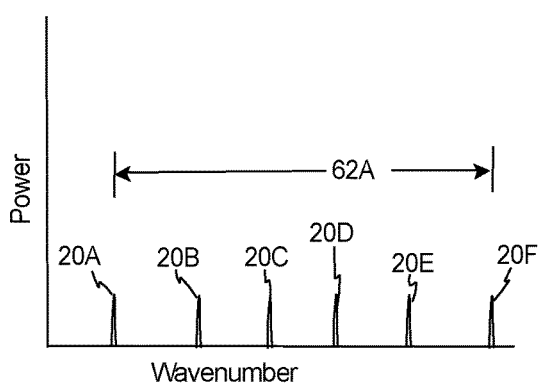
FIG. 1D is a simplified illustration of a first set of different center wavenumbers versus power generated by the laser assembly of FIG. 1A.

FIG. 1D is a simplified graph that illustrates a first set of different center wavenumbers of the laser beams 20A-20F generated by the emitters 18 (illustrated in FIG. 1A) when the beam adjuster 42 (illustrated in FIG. 1A) has a first demagnification (e.g. two times). In this example, the assembly output beam 12 (illustrated in FIG. 1A) will have a first spectral width 62A.

Figure 1E:
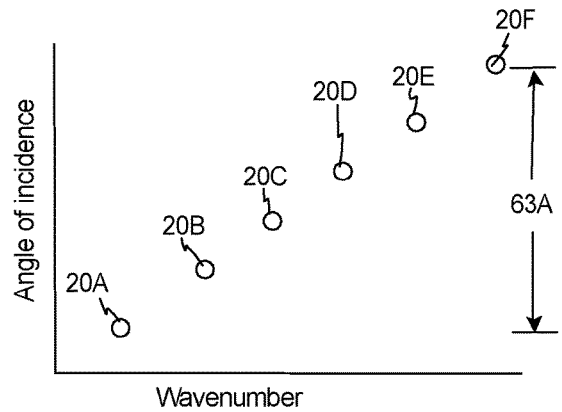
FIG. 1E is a simplified illustration of the first set of different center wavenumbers versus angle of incidence on a beam combiner.

FIG. 1E is a simplified graph that illustrates of the first set of different center wavenumbers versus angle of incidence. In this embodiment, the laser beams collectively have a first range 63A of angles of incidence.

Figure 1F:
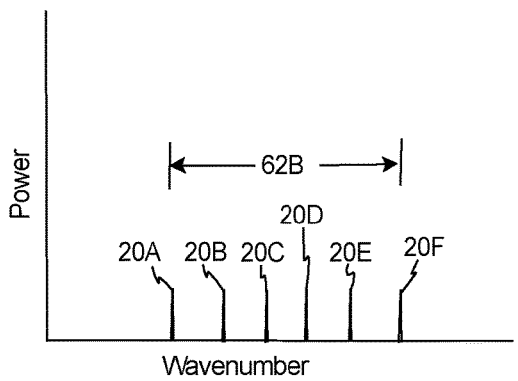
FIG. 1F is a simplified illustration of a second set of different center wavenumbers versus power generated by the laser assembly of FIG. 1A.

Somewhat similarly, FIG. 1F is a simplified graph that illustrates a second set of different center wavenumbers of the laser beams 20A-20F generated by the emitters 18 (illustrated in FIG. 1A) when the beam adjuster 42 (illustrated in FIG. 1A) has a second demagnification (e.g. three times). In this example, the assembly output beam 12 (illustrated in FIG. 1A) will have a second spectral width 60B that is less than the first spectral width 62A of FIG. 1D.

Figure 1G:
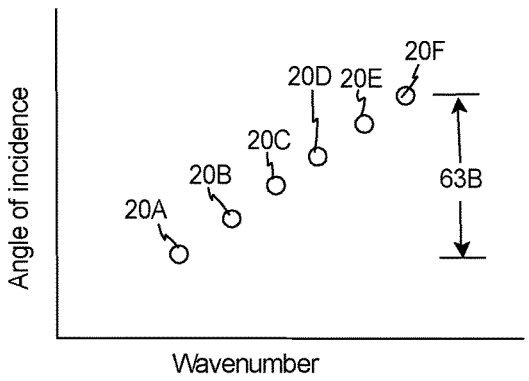
FIG. 1G is a simplified illustration of the second set of different center wavenumbers versus angle of incidence on the beam combiner.

FIG. 1G is a simplified graph that illustrates of the second set of different center wavenumbers versus angle of incidence. In this embodiment, the laser beams collectively have a second range 63B of angles of incidence that is less than the first range 63A illustrated in FIG. 1E.

Figure 1H:
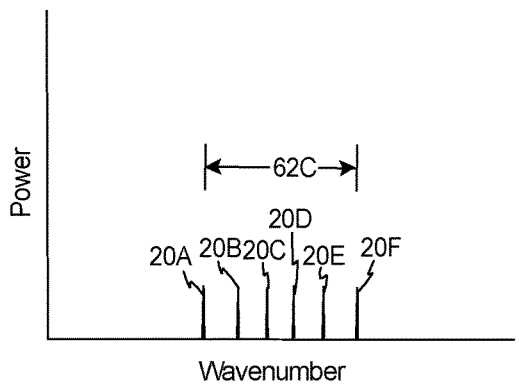
FIG. 1H is a simplified illustration of a third set of different center wavenumbers versus power generated by the laser assembly of FIG. 1A.

Further, FIG. 1H is a simplified graph that illustrates a third set of different center wavenumbers of the laser beams 20A-20F generated by the emitters 18 (illustrated in FIG. 1A) when the beam adjuster 42 (illustrated in FIG. 1A) has a third demagnification (e.g. four times). In this example, the assembly output beam 12 (illustrated in FIG. 1A) will have a third spectral width 62C that is less than the second spectral width 62B of FIG. 1E.

Figure 1I:
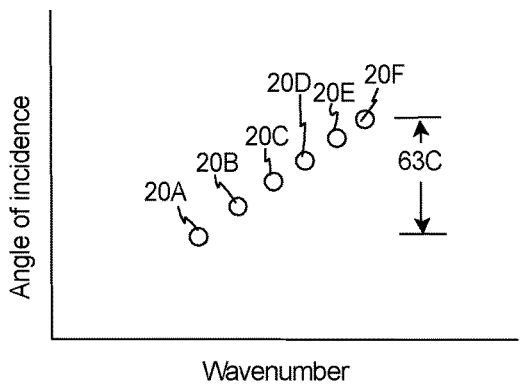
FIG. 1I is a simplified illustration of the third set of different center wavenumbers versus angle of incidence on the beam combiner.

FIG. 1I is a simplified graph that illustrates of the third set of different center wavenumbers versus angle of incidence. In this embodiment, the laser beams collectively have a third range 63C of angles of incidence that is less than the second range 63B illustrated in FIG. 1G.

Figure 2:
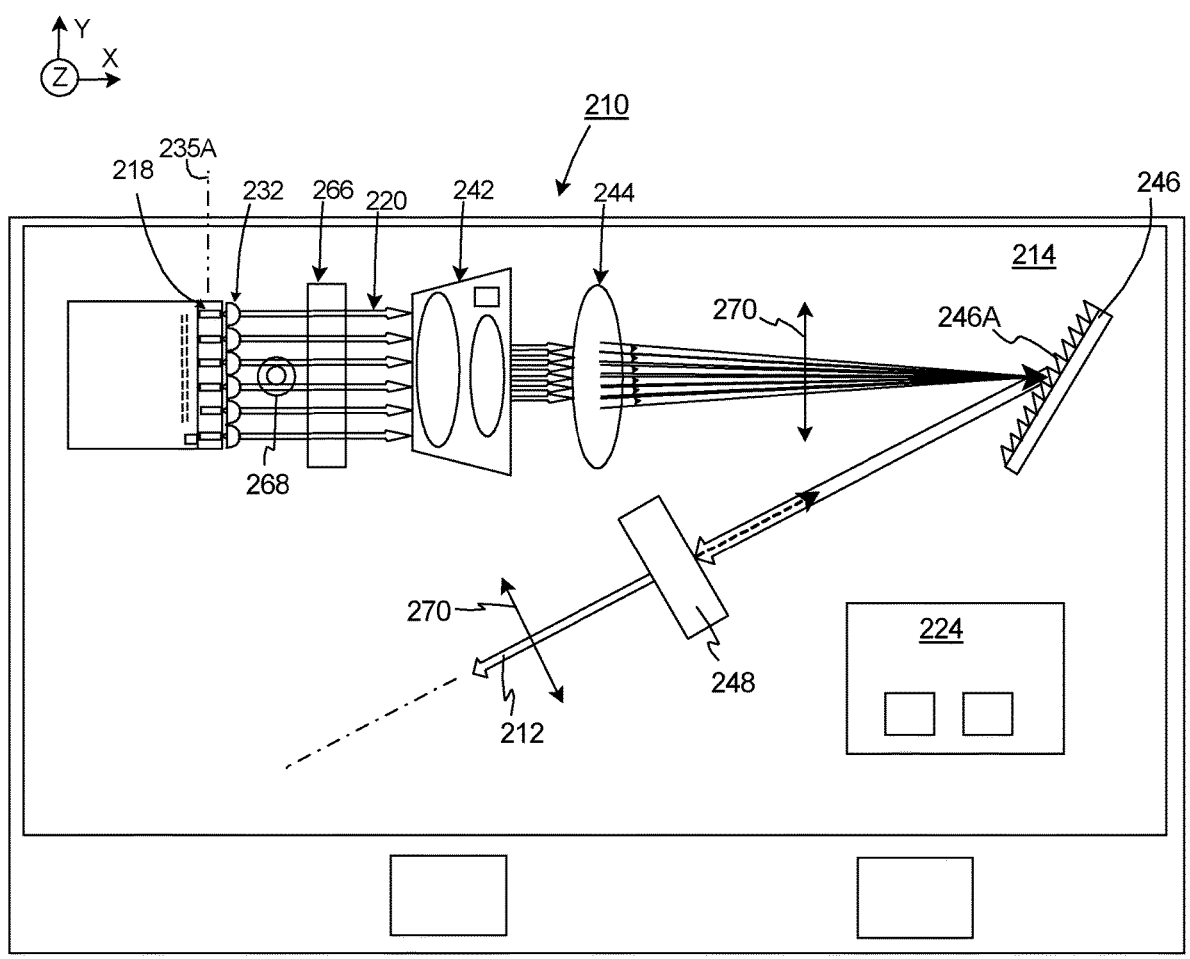
FIG. 2 is a simplified illustration of another embodiment of a laser assembly.

FIG. 2 is a simplified top illustration of another embodiment of a laser assembly 210 that generates an assembly output beam 212. In this embodiment, the laser assembly 210 includes a laser frame 214, an array of emitters 218, a lens array 232, a beam adjuster 242, a transform lens assembly 244, a beam combiner 246, and an output coupler 248 that are similar to the corresponding components described above and illustrated in FIG. 1A. However, in this embodiment, the laser assembly 210 additionally includes a polarization rotator 266 (illustrated as a box) positioned between lens array 232 and the beam combiner 246. It should be noted that the embodiment illustrated in FIG. 2 could be designed without the beam adjuster 242.

As provided above, each emitter 218 can be a Quantum Cascade emitter or other type of emitter that is bonded/mounted epi-side down. As a result, the laser beam 220 from each emitter 218 will have an electric field (polarization) having a first orientation 268 (into the page along the Z axis, as illustrated by concentric circles in FIG. 2A) that is perpendicular (normal) to the emitter array axis 235A of the emitters 218. However, if the wavelength selective beam combiner 246 is a grating, the beam combiner 246 will diffract laser beams with an electric field having a second orientation 270 that is perpendicular to the grating grooves (and parallel to the emitter array axis 235A) more efficiently than laser beams having the first orientation 268 because the ridges 246A of the grating 246 will be oriented perpendicular to the second orientation of the laser beams. Stated in another fashion, the grating 246 is more efficient for light having an E field polarization that is normal (perpendicular) to grooves 246A. The diffraction gratings have higher diffraction efficiency and bandwidth when the incident polarization is perpendicular to the axis of grating grooves 246A.

Stated in yet another fashion, the laser beams 220 from each emitter 218 will can have an s-polarization, and the polarization rotator 266 can rotate the laser beams at the beam combiner 246 to have a p-polarization.

In the embodiment illustrated in FIG. 2, the polarization rotator 266 is a ninety degrees rotator that rotates the first orientation 268 of the laser beams 220 generated by the emitters 218 to the second orientation 270 (illustrated as a two headed arrow) laser beams that are directed at the beam combiner 246. Further, with this design, the output beam 212 will have the second orientation 270, and the laser beams that propagate from the beam combiner 246 towards the emitters 218 are rotated back to the first orientation 268 with the polarization rotator 266 prior to returning to the emitters 218. This will improve the gain in each of the emitters 218, which can have a polarization dependent gain. For example, a Quantum Cascade emitter will have strong gains for a returning beam with a polarization that is perpendicular to the gain layers.

In this embodiment, the polarization for laser beams 220 propagating from the emitters 218 to the beam combiner 246 (from left to right in FIG. 2) are rotated ninety degrees by the polarization rotator 266 from the first orientation 268 to the second orientation 270. Further, the polarization for laser beams 220 propagating from the beam combiner 246 to the emitters 218 (from right to left in FIG. 2) are rotated ninety degrees by the polarization rotator 266 from the second orientation 270 to the first orientation 268.

In one embodiment, the polarization rotator 266 is wavelength insensitive to the spectral bandwidth of the assembly output beam 212. The polarization rotator 266 can be on axis or off axis and include one or more waveplates. In one embodiment, the polarization rotator 266 can include a first rotator element (not shown) and a second rotator element (not show), and each rotator element rotates the polarization of the light (E field polarization) by forty-five degrees. This embodiment results in high efficiency for wide gain-bandwidth sources such as Quantum Cascade lasers. Other, non-exclusive examples of the polarization rotator 266 can be (i) a one-half wave, non-dispersive polarization rotator; (ii) a one-half wave Rhomb, dovetail, or other prism polarization rotator that rotates the polarization of the input beam without rotating the image; (iii) a dispersion-compensated wave plate; (iv) an achromatic on-half wave plate; (iv) a thin film polarization rotating coating; (v) dispersive polarization rotator; (vi) a multi-order wave plate; or (vii) a zero order wave plate.

In one embodiment, the polarization rotator 266 rotates each beam ninety degrees and has low dispersion. As provided herein, "low dispersion" shall mean that the polarization rotation angle does not substantially change with the emission wavelength. In one embodiment, low dispersion means that the polarization rotation angle for each of the beams is limited to 89-91 degree range across 3-12 um wavelength range. In another embodiment, low dispersion means that the polarization rotation varies less than +/−ten degrees over the operating bandwidth of the laser. In another example, if the polarization rotator 266 is designed to rotate all of the beams 90 degrees, all of the beams will have the polarization rotated between 89 to 91 degrees. In this example, the wavelength range of the beams can be three to twelve microns.

It should be noted that in the embodiment illustrated in FIG. 2, the polarization rotator 266 is positioned between the lens array 232 and the beam adjuster 242. However, the polarization rotator 266 can be positioned in another location between the lens array 232 and the beam combiner 246.

Figure 3:
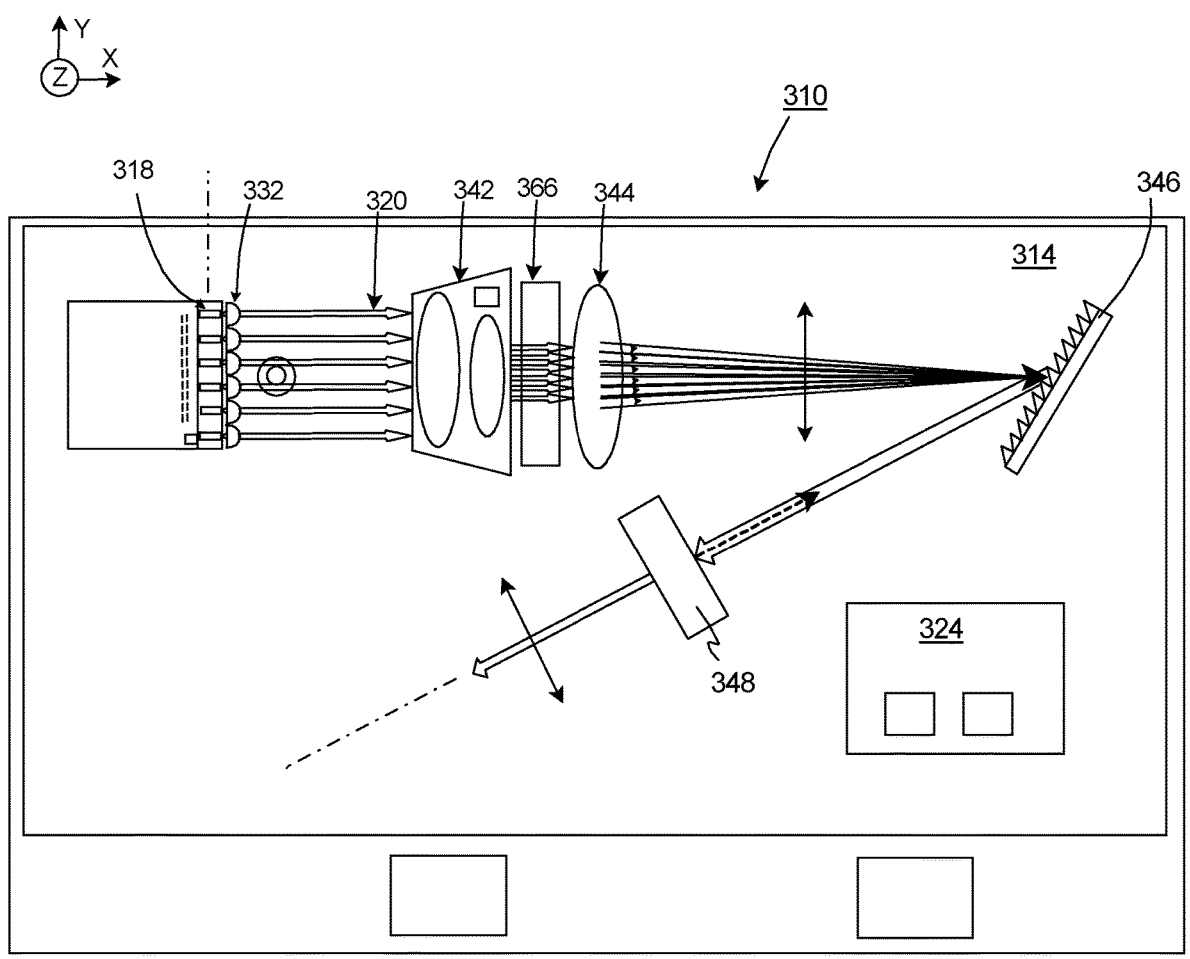
FIG. 3 is a simplified illustration of still another embodiment of a laser assembly.

For example, FIG. 3 is a simplified top illustration of yet another embodiment of a laser assembly 310 that includes a laser frame 314, an array of emitters 318, a lens array 332, a beam adjuster 342, a transform lens assembly 344, a beam combiner 346, an output coupler 348, and a polarization rotator 366 that are similar to the corresponding components described above and illustrated in FIG. 2. However, in this embodiment, the polarization rotator 366 is positioned between the beam adjuster 342 and the transform lens assembly 344. It should be noted that the embodiment illustrated in FIG. 3 could be designed without the beam adjuster 342.

Figure 4:
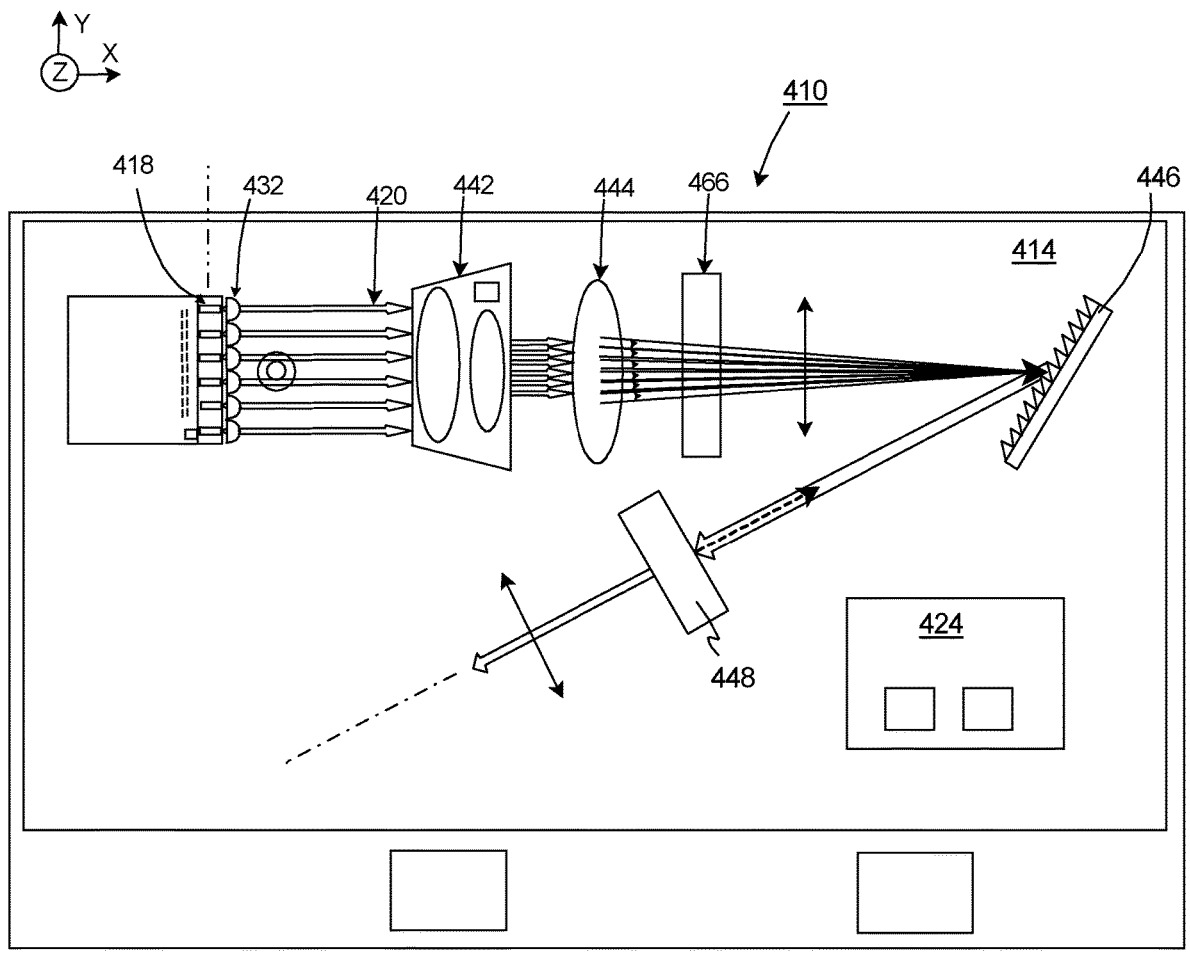
FIG. 4 is a simplified illustration of yet another embodiment of a laser assembly.

FIG. 4 is a simplified top illustration of still another embodiment of a laser assembly 410 that includes a laser frame 414, an array of emitters 418, a lens array 432, a beam adjuster 442, a transform lens assembly 444, a beam combiner 446, an output coupler 448, and a polarization rotator 466 that are similar to the corresponding components described above and illustrated in FIG. 2. However, in this embodiment, the polarization rotator 466 is positioned between the transform lens assembly 444 and the beam combiner 446. It should be noted that the embodiment illustrated in FIG. 4 could be designed without the beam adjuster 442.

Figure 5:
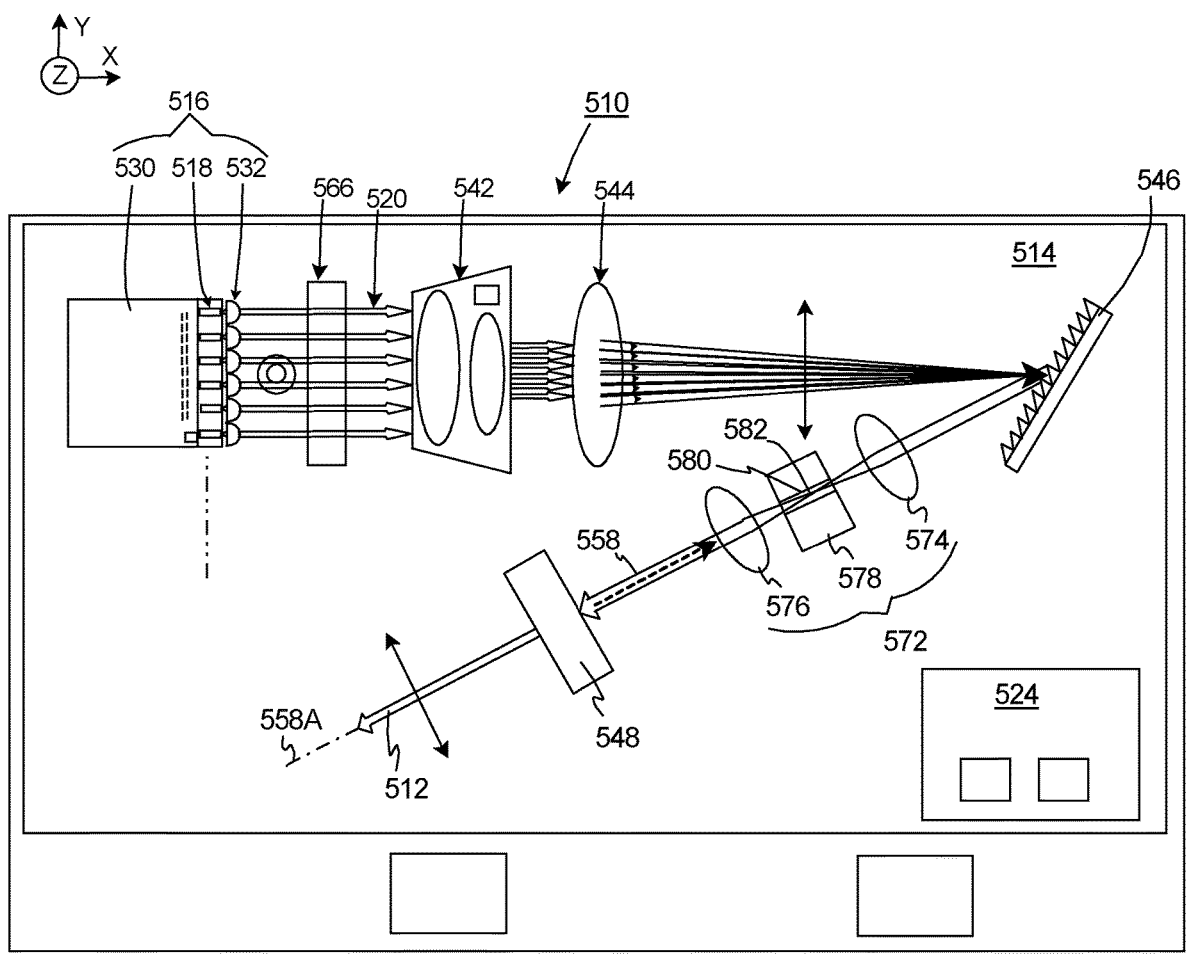
FIG. 5 is a simplified illustration of another embodiment of the laser assembly.

FIG. 5 is a simplified top illustration of still another embodiment of a laser assembly 510 that includes (i) a laser frame 514, (ii) a laser subassembly 516 that includes a laser mount 530, an array of emitters 518 and a lens array 532, (iii) a beam adjuster 542, (iv) a transform lens assembly 544, (v) a beam combiner 546, (vi) an output coupler 548, and (vii) a polarization rotator 566 that are similar to the corresponding components described above and illustrated in FIG. 1 or 2. However, in this embodiment, the laser assembly 510 also includes a spatial filter 572 that is positioned between the beam combiner 546 and the output coupler 548.

It should be noted that the embodiment illustrated in FIG. 5 could be designed without the beam adjuster 542 and/or the polarization rotator 566.

In FIG. 5, the spatial filter 572 reduces cross-talk by reducing light that is slightly off axis. Stated in another fashion, the spatial filter 572 located between beam combiner 546 and output coupler 548 reduces and suppresses optical crosstalk.

As provided herein, the desirable modes of the external cavity propagate between the high reflectivity coated facet of their respective individual emitter 518 and the output coupler 548, in a manner that for each mode the beam 558 is normal to the output coupler 548. The portions of the beams transmitted thru the output coupler 548 travel concentrically and colinearly to each other, forming the high quality assembly output beam 512. The portions of the beams reflected off of the output coupler 548 return to their corresponding emitters 518, rather than neighboring emitters 518.

Crosstalk is a phenomenon when, for example, an external cavity of a first emitter (including the grating and the output coupler) is lasing at one or more undesirable modes, a portion of the first beam from the first emitter will reflect off of the output coupler 548 at an angle which is not normal to the output coupler 548 and return to an adjacent emitter, e.g. a second emitter. The transmitted portion of the incident beams from cross talk modes will exit the cavity at different (non-normal) angles than the desirable modes, thus degrading the quality of the assembly output beam 512.

As provided herein, the spatial filter 572 will suppress lasing at the crosstalk external cavity modes by preferentially increasing intra-cavity losses of such modes.

The spatial filter 572 can have (i) diffraction limited transmission for the combination beam 558; (ii) high losses for non-diffraction limited components of the combination beam 558; (iii) high transmission for optical bandwidth of the combination beam 558 and optimized to minimize dispersion effects.

The design of the spatial filter 572 can be varied. In the non-exclusive embodiment illustrated in FIG. 5, the spatial filter 572 includes a first spatial lens 574, a second spatial lens 576 that is spaced apart from the first spatial lens 574, and a beam trimmer 578 positioned between the spatial lenses 574, 576. In this embodiment, the spatial lenses 574, 576 and the beam trimmer 578 are centered on the combination axis 558A. Further, (i) each spatial lens 574, 576 is operable in the wavenumbers of the assembly output beam 512; (ii) the first spatial lens 574 focuses the combination beam 558 at a focal area 582; (iii) the beam trimmer 578 can be a block that includes a transmission aperture 580 (e.g. a pinhole or slit) that is position at the focal area 582; and (iv) the second spatial lens 576 can be a collimation lens.

Figure 6:
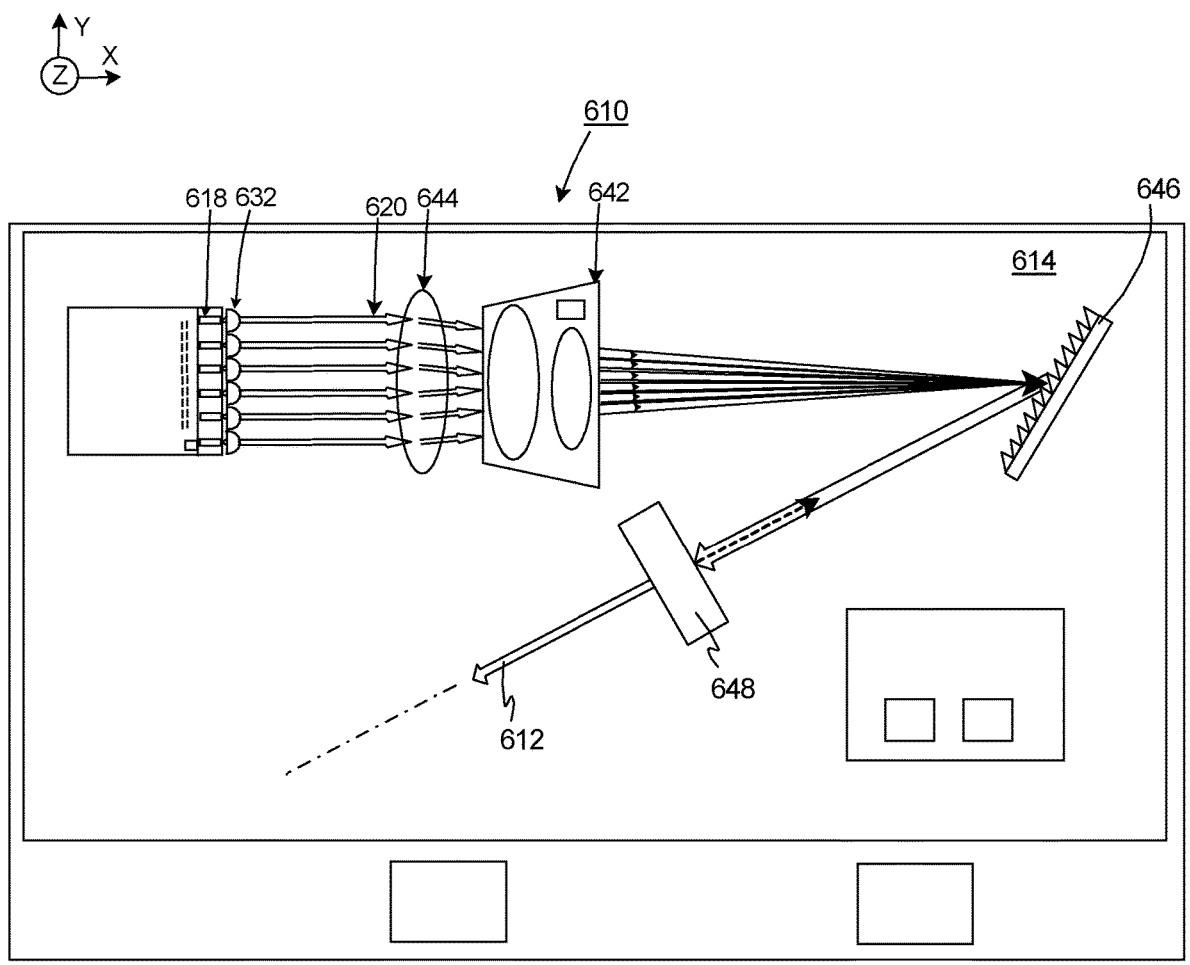
FIG. 6 is a simplified illustration of yet another embodiment of a laser assembly.

FIG. 6 is a simplified top illustration of still another embodiment of a laser assembly 610 that generates an assembly output beam 612. In this embodiment, the laser assembly 610 includes a laser frame 614, an array of emitters 618, a lens array 632, a beam adjuster 642, a transform lens assembly 644, a beam combiner 646, and an output coupler 648 that are similar to the corresponding components described above and illustrated in FIG. 1A. However, in this embodiment, the beam adjuster 642 is positioned between the transform lens assembly 644 and the beam combiner 646. With this design, the beam adjuster 642 reduces the range of angles of incidences of at least some of the laser beams 620 on the beam combiner 646 and reduces the resulting spectral width of the assembly output beam 612. Stated in another fashion, the beam adjuster 642 reduces at least some of angles of incidences of the laser beams 620 on the beam combiner 646 as compared to a design without the beam adjuster 642. It should be noted that in this embodiment, and the previously discussed embodiments, an angle of incidence of the center beam may not be affected by the beam adjuster 642, while the angle of incidence of the other beams will be adjusted by the beam adjuster 642.

It should also be noted that the spatial filter 572 of FIG. 5 can be implemented in any of the laser assemblies 10, 210, 310, 410, 610 disclosed herein. Further, a polarization rotator can be implemented in each of these embodiments.

Figure 7:
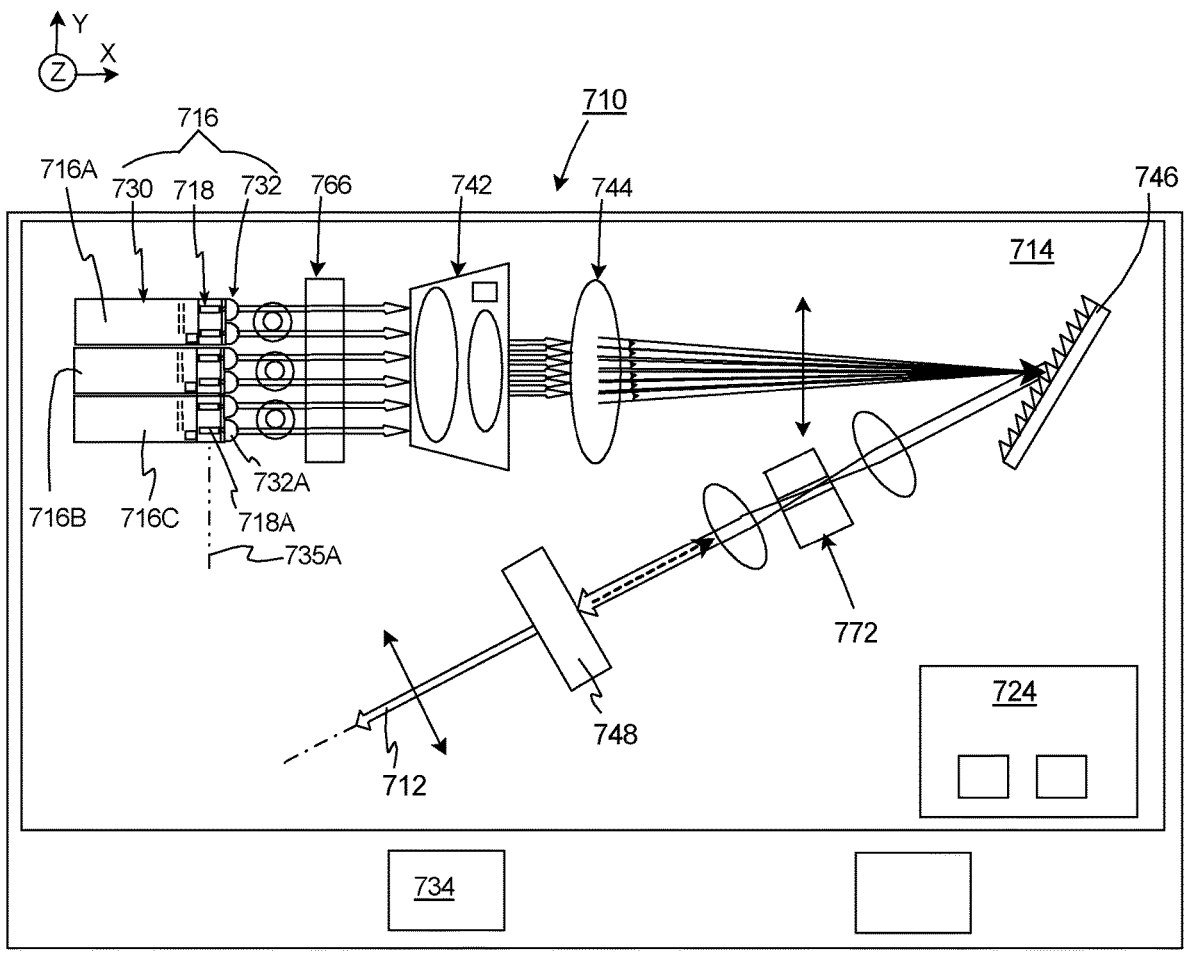
FIG. 7 is a simplified illustration of still another embodiment of a laser assembly.

FIG. 7 is a simplified illustration of still another embodiment of a laser assembly 710. In this embodiment, the laser assembly 710 includes (i) a laser frame 714, (ii) a laser subassembly 716 having a plurality of laser mounts 730, an array of emitters 718, and a lens array 732, (iii) a wavelength selective beam adjuster 742, (iv) a transform lens assembly 744, (v) a beam combiner 746, (vi) an output coupler 748, (vii) a polarization rotator 766, and (viii) a spatial filter 772 that are similar to the corresponding components described above and illustrated in FIG. 5.

However, in the embodiment illustrated in FIG. 7, the laser subassembly 716 is divided into multiple, separate laser modules, e.g. a first laser module 716A, a second laser module 716B, and a third laser module 716C that are positioned so that the emitters 718A are aligned and spaced apart along the emitter array axis 735A. In FIG. 7, the laser subassembly 716 is divided into three separate laser modules 716A-716C. Alternatively, laser subassembly 716 can be divided into more than three or fewer than three laser modules 716A-716C.

In one embodiment, each laser module 716A-716C includes a separate laser mount 730, a separate set of one or more emitters 718A, and the corresponding number of lenses 732A. In the simplified example illustrated in FIG. 7, each laser module 716A-716C includes a set of two emitters 718A that are spaced apart along the emitter array axis 735A and a set of two lenses 732A that are aligned along the lens array axis. As alternative, non-exclusive examples, each laser module 716A-716C can include a set of at least 1, 2, 3, 4, 5, 7, 8, 9, 10, 15, 20, 25, or 30 separate emitters 718A that are tightly arranged along the linear emitter array 735A, and the corresponding number of lenses 732A.

For example, the division of the laser subassembly 716 into multiple different modules 716A, 7168, 716C can make the laser subassembly 716 easier to manufacture and/or can provide more accurate thermal control with the thermal controller 734. For example, because the emitters 718A on the first laser module 716A will lase at different center wavenumbers than the emitters 718A on the third laser module 716C, it may be necessary to have the emitters 718A on the first laser module 716A be different from the emitters 718A on the third module 716C. Thus, it may be easier to make them differently if they are part of different modules 716A, 716C. Further, the cooling requirements for the emitters 718A may be different for each of the laser modules 716A-716C. Thus, accurately controlling the temperature of the emitters 718A can be simplified by individually cooling the laser modules 716A-716C with the thermal controller 734.

It should be noted that the embodiment illustrated in FIG. 7 could be designed without the beam adjuster 742, the spatial filter 772, and/or the polarization rotator 766.

It should be noted that (i) the emitters 718A on the first laser module 716A can be referred to as first emitters; (ii) the emitters 718A on the second laser module 716B can be referred to as second emitters; and (iii) the emitters 718A on the third laser module 716C can be referred to as third emitters. Further, the first emitters are spaced apart from the second emitters along the emitter array axis 735A, and the second emitters are spaced apart from the third emitters along the emitter array axis 735A.

Figure 8A:
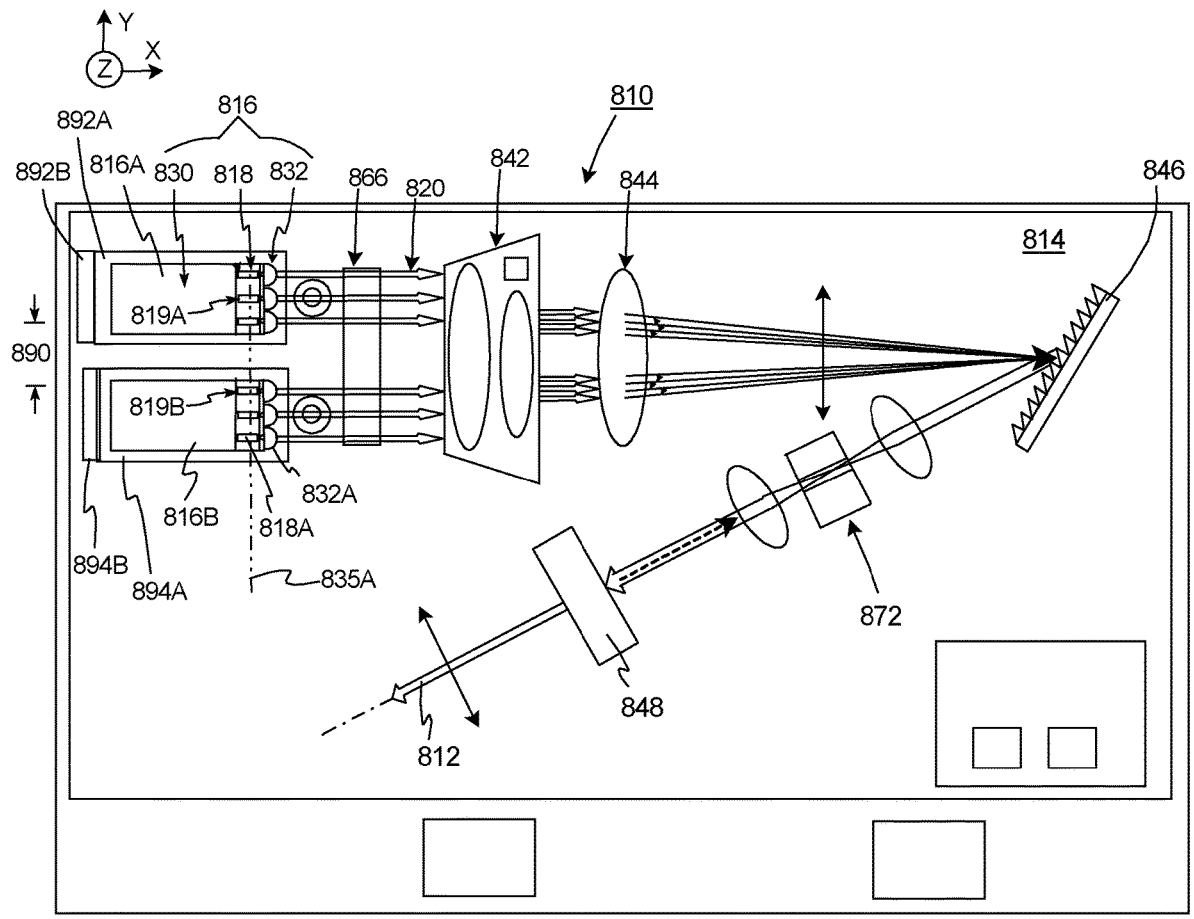
FIG. 8A is a simplified illustration of another embodiment of a laser assembly.

FIG. 8A is a simplified illustration of another embodiment of a laser assembly 810 that includes (i) a laser frame 814, (ii) a laser subassembly 816 that includes a plurality of laser mount 830, an array of emitters 818 and a lens array 832, (iii) a wavelength selective beam adjuster 842, (iv) a transform lens assembly 844, (v) a beam combiner 846, (vi) an output coupler 848, (vii) a polarization rotator 866, and (viii) a spatial filter 872 that are similar to the corresponding components described above and illustrated in FIG. 7. Further, an assembly output beam 812 will be multispectral because each of the individual emitters 818A is lasing at a different center wavenumber as a result of the arrangement of the laser assembly 810.

However, in the embodiment illustrated in FIG. 8A, the laser subassembly 816 is divided into multiple, separate laser modules, e.g. a first laser module 816A, and a second laser module 816B that are positioned so that the emitters 818A are aligned and spaced apart along the emitter array axis 835A. In FIG. 8A, the laser subassembly 816 is divided into two separate laser modules 816A, 816B. Alternatively, laser subassembly 816 can be divided into more than two laser modules 816A, 816B.

In this embodiment, each laser module 816A, 816B includes a separate laser mount 830, a separate set of emitters 818A, and a corresponding set of lenses 832A. In the simplified example illustrated in FIG. 8A, each laser module 816A, 816B includes a set of three emitters 818A that are spaced apart along the emitter array axis 835A and a set of three lenses 832A that are aligned along the lens array axis. As alternative, non-exclusive examples, each laser module 816A, 816B can include at least 1, 2, 3, 4, 5, 7, 8, 9, 10, 15, 20, 25, or 30 separate emitters 818A that are tightly arranged in the linear emitter array 835A, and the corresponding number of lenses 832A. It should be noted that the emitters 818A for the first laser module 816A can be referred to as a first set of emitters 819A or first emitters, and the emitters 818A for the second laser module 816B can be referred to as a second set of emitters 819B of second emitters.

In certain embodiments, (i) the laser modules 816A, 816B are spaced apart, and (ii) the first set of emitters 819A of the first laser module 816A are spaced apart an emitter separation distance 890 along the emitter array axis 835A from the second set of emitters 819B of the second laser module 816B. In alternative, non-exclusive embodiments, the emitter separation distance 890 is at least 0.1, 0.5, 1, 5, 10, 50, or 100 millimeters.

With the design illustrated in FIG. 8A, each emitters 818A will lase at a different center wavenumber. In FIG. 8A, each of the emitters 818A of the first set of emitters 819A will generate a laser beam 820 having a different center wavenumber that is within a relative small first spectral range ("first color range") because the emitters 818A of the first laser module 816A are physically relatively close together. Similarly, each of the emitters 818A of the second set of emitters 819B will generate a laser beam 820 having a different center wavenumber that is within a relative small second spectral range ("second color range") because the emitters 818A of the second laser module 816B are physically relatively close together.

Further, there will be a spectral gap between the first spectral range and the second spectral range, and the size of that spectral gap will depend on the size of the emitter separation distance 890. Generally speaking, this spectral gap will increase as the emitter separation distance 890 is increased, and this spectral gap will decrease as the emitter separation distance 890 is decreased.

As alternative, non-exclusive examples, (i) the first spectral range can be less than 0.025, 0.05, 0.1, 0.2, 0.3, 0.5, 0.75, 1, 1.5, or 3 microns; (ii) the second spectral range can be less than 0.025, 0.05, 0.1, 0.2, 0.3, 0.5, 0.75, 1, 1.5, or 3 microns; and (iii) the spectral gap can be greater than 0.1, 0.5, 1, 2, 5, or 10 microns.

With the present design, (i) the wavenumbers in the first spectral range; (ii) the wavenumbers in the second spectral range; and (iii) the size of the spectral gap can be adjusted by adjusting the position of each laser module 816A, 816B relative to the other components.

In one nonexclusive embodiment, (i) the first laser module 816A can include a first stage 892A that retains the laser mount 830 of the first laser module 816A, and a first mover 892B that can selectively move the first stage 892A and the laser mount 830 of the first laser module 816A to selectively adjust the location of the first set of emitters 819A along the emitter array axis 835A; and/or (ii) the second laser module 816B can include a second stage 894A that retains the laser mount 830 of the second laser module 816B, and a second mover 894B that can selectively move the second stage 894A and the laser mount 830 of the second laser module 816B to selectively adjust the location of the second set of emitters 819B along the emitter array axis 835A.

With this design, (i) the first mover 892B can be controlled to position the first set of emitters 819A to achieve the desired wavenumbers in the first spectral range; and (ii) the second mover 894B can be controlled to position the second set of emitters 819B to achieve the desired wavenumbers in the second spectral range. With this design, the movers 892B, 894B can be controlled to account for transform lens dispersion effects.

It should be noted that one or both movers 892B, 894B can be an actuator such as a linear actuator. Alternatively, one or both movers 892B, 894B can be a manual type of mover. Still alternatively, one or both laser modules 816A, 816B can be individually positioned without the respective stage and/or mover.

As provided herein, the division of the laser subassembly 816 into multiple different modules 816A, 816B can make the laser subassembly 816 easier to manufacture, can allow for adjustment of the spectral ranges, and/or can provide more accurate thermal control with the thermal controller 834.

It should be noted that the embodiment illustrated in FIG. 8A could be designed without the beam adjuster 842, the spatial filter 872, and/or the polarization rotator 866. It should also be noted that the laser subassembly 816 can be designed to include three or more laser modules 816A, 816B that are spaced apart along the emitter array axis 835A.

Figure 8B:
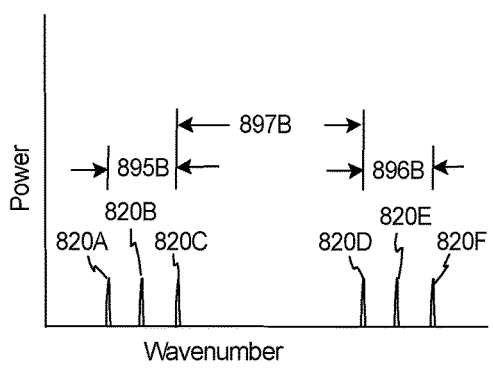
FIG. 8B is a simplified illustration of a first set of different center wavenumbers versus power generated by the laser assembly of FIG. 8A.

FIG. 8B is a simplified graph that illustrates (i) the different center wavenumbers 820A-820C of the laser beams generated by the first set of emitters 819A (illustrated in FIG. 8A) of the laser assembly 810 of FIG. 8A span a first spectral range 895B; (ii) the different center wavenumbers 820D-820F of the laser beams generated by the second set of emitters 819B (illustrated in FIG. 8A) of the laser assembly 810 of FIG. 8A span a second spectral range 896B; and (iii) the size of the spectral gap 897B that separates the spectral ranges 895B, 896B.

With reference to FIGS. 8A and 8B, each of the emitters 818A of the first set of emitters 819A will have a different center wavenumber that is within the relative small first spectral range 895B because the emitters 818A of the first laser module 816A are relatively close together. Similarly, each of the emitters 818A of the second set of emitters 819B will have a different center wavenumber that is within the relative small second spectral range 896B because the emitters 818A of the second laser module 816B are relatively close together.

Further, as provided above, (i) the wavenumbers in the first spectral range 895B; (ii) the wavenumbers in the second spectral range 896B; and (iii) the size of the spectral gap 897B can be adjusted by adjusting the position of each laser module 816A, 816B relative to the other components.

Figure 8C:
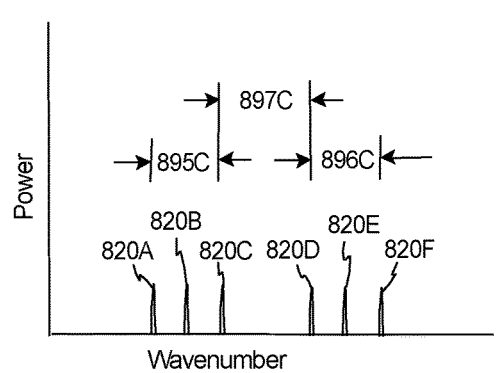
FIG. 8C is a simplified illustration of another set of different center wavenumbers versus power generated by the laser assembly of FIG. 8A.

FIG. 8C is a simplified graph that illustrates another set of wavenumbers that can be generated by the laser assembly 810 of FIG. 8A when both laser modules 816A, 816B are moved (not shown) to reduce the emitter separation distance 890. With reference to FIGS. 8A and 8C, (i) the different center wavenumbers 820A-820C of the laser beams generated by the first set of emitters 819A (illustrated in FIG. 8A) of the laser assembly 810 span the first spectral range 895C; (ii) the different center wavenumbers 820D-820F of the laser beams generated by the second set of emitters 819B (illustrated in FIG. 8A) of the laser assembly 810 of FIG. 8A span the second spectral range 896C; and (iii) the size of the spectral gap 897C has been reduced.

Figure 9:
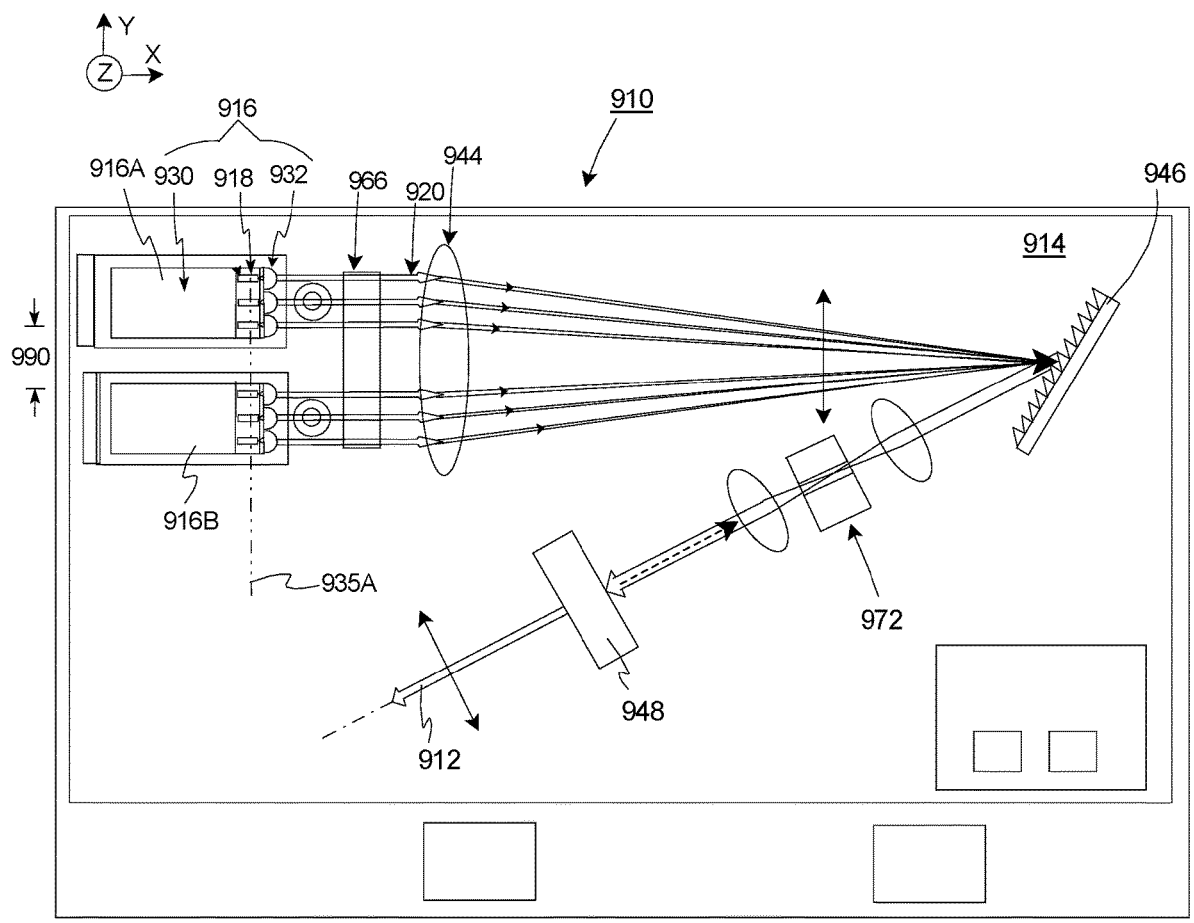
FIG. 9 is a simplified illustration of still another embodiment of a laser assembly.

FIG. 9 is a simplified illustration of still another embodiment of a laser assembly 910 that includes (i) a laser frame 914, (ii) a laser subassembly 916 having a plurality of laser mounts 930, an array of emitters 918 and a lens array 932, (iii) a transform lens assembly 944, (iv) a wavelength selective beam combiner 946, (v) an output coupler 948, (vi) a polarization rotator 966, and (vii) a spatial filter 972 that are similar to the corresponding components described above and illustrated in FIG. 8A.

In FIG. 9, the laser subassembly 916 includes a first laser module 916A, and a second laser module 916B that are spaced apart an emitter separation distance 990 along an emitter array axis 935A. The laser modules 916A, 916B can be similar to the corresponding components described above and illustrated in FIG. 8A. However, the laser assembly 910 of FIG. 9 does not include a beam adjuster 842 (illustrated in FIG. 8A). As a result thereof, the laser subassembly 916 will utilize fewer emitters 918 for a given form factor, and the spectral width of the assembly output beam 912 may be greater than the embodiment illustrated in FIG. 8A. Further, a larger transform lens assembly 944 may be necessary to direct the beams 920 at the beam combiner 946.

It should be noted that the embodiment illustrated in FIG. 9 could be designed without the spatial filter 972, and/or the polarization rotator 966. It should also be noted that the laser subassembly 916 can be designed to include three or more laser modules 916A, 916B that are spaced apart along the emitter array axis 935A.

FIG. 10 is a simplified illustration of another embodiment of a polarization rotator 1066 that can be used in the laser assemblies 10, 210, 310, 410, 510, 610, 710, 810, 910 described above to rotate each laser beam 1020 (only one is illustrated) ninety degrees and has low dispersion. In this embodiment, the polarization rotator 1066 is a rhombohedral half wave plate. In this design, there are two internal reflections, with each reflection rotating the polarization by 45 degrees. Further, the half wave plate rhombohedral can include optical coatings to reduce reflective losses.

Figure 11:
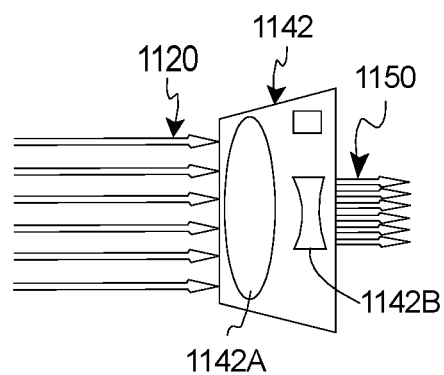
FIG. 11 is a simplified illustration of another embodiment of a wavelength selective beam adjuster.

FIG. 11 is a simplified illustration of another embodiment of a wavelength selective beam adjuster 1142 having features of the present invention. In this embodiment, the beam adjuster 1142 again compresses the spacing between the laser beams 1120 to provide the adjusted laser beams 1150, and adjusts the spectral width of the assembly output beam (not shown in FIG. 11). Depending upon the direction in which the laser beams are propagating, the beam adjuster 1142 can spatially demagnify or spatially magnify the laser beams. In FIG. 11, for the laser beams 1120 propagating left to right, the beam adjuster 1142 demagnifies the beam array by first converging and subsequently collimating the laser beams 1120 to provide the array of adjusted laser beams 1150 that are more tightly packed. Alternatively, for laser beams propagating from right to left in FIG. 11, the beam adjuster 1142 magnifies the beam array by first diverging and subsequently collimating the laser beams. With this design, the beam adjuster 1142 expands the spacing between the laser beams moving right to left so that the laser beams are properly spaced to be directed back to the respective emitters (not shown in FIG. 12).

With reference to FIG. 11, the beam adjuster 1142 is somewhat similar to a Galilean telescope and includes a first adjuster lens 1142A (bi-convex objective lens) and a second adjuster lens 1142B (bi-concave ocular) that are spaced apart.

It should also be noted that the laser assemblies 10, 210, 310, 410, 510, 610, 710, 810, 910 provided herein can be used in many different applications, including, but not limited to, spectroscopy, chemical detection, medical diagnostics, pollution monitoring, leak detection, analytical instruments, homeland security, remote chemical sensing, industrial process control.

For example, if the laser assemblies 10, 210, 310, 410, 510, 610, 710, 810, 910 are used for spectroscopy, (i) the system can be designed so that wavenumbers of the assembly output beam coincide with absorption peaks of materials being detected; (ii) the system can be designed so that wavenumbers of the assembly output beam coincide with transparencies of the materials being detected for purposes of baselining system performance; (iii) the system can have individually controllable emitters for single or multiple co-propagating wavelengths with individual control.

Still alternatively, for example, the laser assemblies 10, 210, 310, 410, 510, 610 can be used on an aircraft (e.g. a plane or helicopter) as part of a jammer system of an anti-aircraft missile.

In yet another design, at least a portion of the refractive optics can be replaced with reflective optics for the laser assemblies 10, 210, 310, 410, 510, 610, While the particular designs as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A laser assembly that generates an assembly output beam, the laser assembly comprising:
    a laser subassembly that emits a plurality of spaced apart, substantially parallel laser beams;
    a beam adjuster positioned in a path of the laser beams, the beam adjuster adjusting the spacing between the plurality of laser beams;
    a transform lens positioned in a path of the laser beams, the transform lens collimating the laser beams and directing the laser beams to spatially overlap at a focal plane of the transform lens;
    a wavelength selective beam combiner positioned at the focal plane that combines the lasers beams to provide a combination beam that is directed along a combination axis; and
    an output coupler positioned on the combination axis that redirects at least a portion of the combination beam back to the beam combiner as a redirected beam, and transmits a portion of the combination beam as the assembly output beam.

2. The laser assembly of claim 1 further comprising a polarization rotator that rotates a polarization of the laser beams that are directed at the beam combiner from the laser subassembly.

3. The laser assembly of claim 2 wherein the laser beams from the laser subassembly have a first polarization orientation, and the laser beams directed at the beam combiner have a second polarization orientation that is ninety degrees different from the first orientation.

4. The laser assembly of claim 1 wherein the beam combiner is a dispersive beam combiner.

5. The laser assembly of claim 1 wherein each of the plurality of spaced apart, substantially parallel laser beams generated by the laser subassembly has a different center wavenumber, and the assembly output beam is multi-spectral.

6. The laser assembly of claim 1 wherein each of the plurality of spaced apart, substantially parallel laser beams generated by the laser subassembly has a different center wavenumber that is in the infrared range.

7. The laser assembly of claim 1 wherein each of the laser beams directed by the transform lens impinge on the beam combiner at a different angle, and wherein the laser beams exiting from the beam combiner are substantially coaxial.

8. The laser assembly of claim 1 further comprising a spatial filter positioned between the beam combiner and the output coupler that suppresses cross-talk.

9. The laser assembly of claim 1 wherein the beam adjuster reduces the spacing between the plurality of laser beams for laser beams propagating from the laser subassembly towards the transform lens.

10. The laser assembly of claim 1 wherein the beam adjuster is selectively adjustable to selectively adjust the spacing between the plurality of laser beams that propagate from the laser subassembly towards the transform lens to selectively adjust a spectral width of the assembly output beam.

11. The laser assembly of claim 1 wherein the laser subassembly includes at least six separate emitters aligned along an emitter array axis, the emitters cooperating to generate at least six, spaced apart, substantially parallel laser beams, with each of the separate laser beams having a different center wavenumber.

12. The laser assembly of claim 1 wherein the laser subassembly includes a plurality of separate emitters, with each emitter generating one of the laser beams, with each of the laser beams having a different center wavenumber; and further comprising a system controller that individually directs current to each of the emitters.

13. The laser assembly of claim 1 wherein the laser subassembly emits a first laser beam having a first center wavenumber, and a second laser beam that is substantially parallel to and spaced apart a first beam separation distance from the first laser beam, the second laser beam having a second center wavenumber that is different from the first center wavenumber; wherein the beam adjuster adjusts the laser beams so that the first laser beam is substantially parallel to and spaced apart from the second laser beam a first adjusted separation distance that is different from the first beam separation distance.

14. The laser assembly of claim 13 wherein the first laser beam from the transform lens impinges on the beam combiner at a first angle of incidence, and the second beam from the transform lens impinges on the beam combiner at a second angle of incidence that is different than the first angle of incidence; and wherein the combination beam is made up of a plurality of beams exiting from the beam combiner that are substantially coaxial.

15. The laser assembly of claim 1 wherein the laser subassembly includes a first laser module that includes a plurality of first emitters, and a second laser module that includes a plurality of second emitters, wherein the first laser module is spaced apart from the second laser module, and the first emitters and the second emitters are aligned along an emitter array axis.

16. A laser assembly that generates an assembly output beam, the laser assembly comprising:
    a laser subassembly that emits a plurality of spaced apart, substantially parallel laser beams;
    a transform lens positioned in a path of the laser beams, the transform lens collimating the laser beams and directing the laser beams to spatially overlap at a focal plane of the transform lens;
    a wavelength selective beam combiner positioned at the focal plane that combines the lasers beams to provide a combination beam that is directed along a combination axis;
    a polarization rotator that rotates a polarization of the laser beams that are directed at the beam combiner from the laser subassembly; and
    an output coupler positioned on the combination axis that redirects at least a portion of the combination beam back to the beam combiner as a redirected beam, and transmits a portion of the combination beam as the assembly output beam.

17. The laser assembly of claim 16 wherein the laser beams from the laser subassembly have a first polarization orientation, and the laser beams directed at the beam combiner will have a second polarization orientation that is ninety degrees different from the first polarization orientation.

18. A laser assembly that generates an assembly output beam, the laser assembly comprising:
    a laser subassembly that emits a plurality of spaced apart, substantially parallel laser beams;
    a transform lens positioned in a path of the laser beams, the transform lens collimating the laser beams and directing the laser beams to spatially overlap at a focal plane of the transform lens
    a wavelength selective beam combiner positioned at the focal plane that combines the lasers beams to provide a combination beam that is directed along a combination axis; and
    an output coupler positioned on the combination axis that redirects at least a portion of the combination beam back to the beam combiner as a redirected beam, and transmits a portion of the combination beam as the assembly output beam; and
    a spatial filter positioned between the beam combiner and the output coupler that suppresses cross-talk.

19. The laser assembly of claim 18 wherein the spatial filter includes a first spatial lens, a second spatial lens that is spaced apart from the first spatial lens, and a beam trimmer positioned between the spatial lenses.

20. A laser assembly that generates an assembly output beam, the laser assembly comprising:
    a laser subassembly that emits a plurality of spaced apart, substantially parallel laser beams, wherein the laser subassembly includes a first laser module that includes a plurality of first emitters, and a second laser module that includes a plurality of second emitters, wherein the first laser module is spaced apart from the second laser module, and the first emitters and the second emitters are aligned along an emitter array axis;
    a transform lens positioned in a path of the laser beams, the transform lens collimating the laser beams and directing the laser beams to spatially overlap at a focal plane of the transform lens;
    a wavelength selective beam combiner positioned at the focal plane that combines the lasers beams to provide a combination beam that is directed along a combination axis; and
    an output coupler positioned on the combination axis that redirects at least a portion of the combination beam back to the beam combiner as a redirected beam, and transmits a portion of the combination beam as the assembly output beam.

21. The laser assembly of claim 20 wherein the first emitters of the first laser module are spaced apart from the second emitters of the second laser module an emitter separation distance along the emitter array axis that is at least 0.5 millimeters, and each laser module includes a laser mount.

22. The laser assembly of claim 20 further comprising a polarization rotator, wherein the laser beams from the laser subassembly have a first polarization orientation, and the polarization rotator rotates the polarization so that the laser beams directed at the beam combiner will have a second polarization orientation that is ninety degrees different from the first polarization orientation.

23. The laser assembly of claim 20 further comprising a beam adjuster positioned in a path of the laser beams, the beam adjuster adjusting the spacing between the plurality of laser beams.

24. The laser assembly of claim 20 further comprising a spatial filter positioned between the beam combiner and the output coupler that suppresses cross-talk.

\* \* \* \* \*